(12) United States Patent
Ichinose et al.

(10) Patent No.: US 6,847,093 B2
(45) Date of Patent: Jan. 25, 2005

(54) SEMICONDUCTOR INTEGRATED CIRCUIT DEVICE

(75) Inventors: Katsuhiko Ichinose, Tokorozawa (JP); Fumio Ootsuka, Ami (JP)

(73) Assignee: Renesas Tehnology Corp., Tokyo (JP)

( * ) Notice: Subject to any disclaimer, the term of this patent is extended or adjusted under 35 U.S.C. 154(b) by 21 days.

(21) Appl. No.: 10/602,697

(22) Filed: Jun. 25, 2003

(65) Prior Publication Data

US 2004/0009636 A1 Jan. 15, 2004

(30) Foreign Application Priority Data

Jun. 25, 2002 (JP) .................................... 2002-184292

(51) Int. Cl.[7] ............................................. H01L 29/00
(52) U.S. Cl. ..................... 257/524; 257/510; 257/513; 257/63; 257/64; 257/65
(58) Field of Search .......................... 257/63–65, 524, 257/510, 513

(56) References Cited

U.S. PATENT DOCUMENTS 6,274,894 B1 * 8/2001 Wieczorek et al. ......... 257/192
6,570,217 B1 * 5/2003 Sato et al. .................. 257/327

OTHER PUBLICATIONS

K. Rim, et al., "Strained Si NMOSFETs for High Performance CMOS Technology, 2001, Symposium on VLSI Technology digest of Technical Papers", pp. 59–60.

* cited by examiner

*Primary Examiner*—Fetsum Abraham
(74) *Attorney, Agent, or Firm*—Antonelli, Terry, Stout & Kraus, LLP

(57) ABSTRACT

A semiconductor integrated circuit device is formed by a semiconductor substrate having an SiGe layer and a first Si layer epitaxially grown thereover, and on which there are element formation regions each partitioned by element isolation regions; a shallow groove isolation, which has a groove formed in each of the element isolation regions and an insulating film inside of the groove, said groove penetrating through the first Si layer and having a bottom in the SiGe layer; a second Si layer formed between the shallow groove isolation and the SiGe layer; and a semiconductor element formed over the main surface of the semiconductor substrate in the element formation regions. This construction enables a reduction in leakage current via the walls of the shallow groove isolation of the strained substrate, thereby improving the element isolation properties.

14 Claims, 33 Drawing Sheets

SEMICONDUCTOR INTEGRATED CIRCUIT DEVICE

BACKGROUND OF THE INVENTION

The present invention relates to a semiconductor integrated circuit device and to a method of manufacture thereof; and, more particularly, the invention relates to a technique that is effective when applied to a semiconductor integrated circuit device using a so-called strained substrate, which is a substrate to which a stress has been applied at a surface portion thereof, and to a method of manufacture of the device.

Characteristics of a semiconductor element, such as a MISFET (Metal Insulator Semiconductor Field Effect Transistor), that is formed over the main surface of a semiconductor substrate are determined by various factors. When a tensile stress is applied to the surface layer of the substrate, the mobility of electrons in a channel region increases, which improves the current driving capacity of the MISFET.

Such a substrate is called a "strained substrate". A description of a MOSFET using such a substrate can be found, for example, in Strained Si MOSFETs for High Performance CMOS Technology (2001 Symposium on VLSI Technology Digest, pp 59 to 60).

SUMMARY OF THE INVENTION

The present inventors have been engaged in research and development of a semiconductor integrated circuit device, and, in particular, they have carried out various investigations on the employment of a strained substrate with a view to improving the characteristics of a MISFET.

Such a strained substrate can be obtained by forming an SiGe film over an Si substrate by epitaxial growth and then forming an Si film over this SiGe film by epitaxial growth. As will be described later, a tensile stress is applied to the uppermost Si film, influenced by an Si—Ge lattice spacing.

Over the substrate, a plurality of elements are to be formed. In order to isolate them from each other, an element isolation in the form of an insulating film is provided. This element isolation is formed, for example, by making a groove in an element isolation region and then embedding an insulating film in the groove. For example, an insulating film, such as a silicon oxide film, is deposited by CVD (Chemical Vapor Deposition) over the substrate, including the inside of the groove, followed by removal of a portion of the insulating film outside the groove by CMP (Chemical Mechanical Polishing), whereby the insulating film is embedded in the groove.

However, direct filling of the CVD insulating film in the groove accelerates the flow of a leakage current along the groove (walls of the element isolation). This is due to a rise in an interface state density between the CVD insulating film and the semiconductor substrate. Therefore, a method of making a groove and, then, after thermal oxidation of the inside walls thereof, embedding a CVD insulating film in the groove is adopted.

On a strained substrate having an SiGe film, however, the interface state density of an SiGe oxide film formed upon oxidation of the inside wall of the groove is one order of magnitude greater than that of an Si oxide film. Accordingly, when a strained substrate is employed, the leakage current becomes greater than that when an Si substrate is used, and, in addition, a problem occurs, such as a deterioration in element isolating properties. In order to overcome the above-described problem, for example, Japanese Patent Application Laid-Open No. 275526/1993 (U.S. Pat. No. 5,266,813) discloses a technique for preventing leakage by providing a single crystal silicon layer 60 as a groove liner.

A semiconductor integrated circuit device is different in constitution, depending on the degree of improvement of its characteristics or the miniaturization requested. Under such a state, the above-disclosed technique is not sufficient for preventing a leakage current, which will be described later in detail.

An object of the present invention is to provide a technique that is capable of improving the element isolating properties of a strained substrate, particularly, to reduce the leakage current occurring via the wall of an element isolation, even in the case where a well has a high concentration, or where a conductive film is disposed over the element isolation.

Another object of the present invention is to improve the element isolating properties of a strained substrate, thereby improving the characteristics of the resulting semiconductor integrated circuit formed over the main surface of the substrate and improving the yield of the device.

The above-described and the other objects and novel features of the present invention will become more apparent from the description herein and the accompanying drawings.

Of the features of the invention disclosed by the present application, a summary of typical aspects of the invention will be described briefly.

According to the semiconductor integrated circuit device of the present invention, an element isolation is formed in a semiconductor substrate, having an SiGe layer and a first Si layer formed by epitaxial growth thereover. It has a second Si layer between the element isolation, which has its bottom in the SiGe layer, and the SiGe layer.

A method of manufacture of a semiconductor integrated circuit device according to the present invention comprises forming, in an element isolation region of a semiconductor substrate having an SiGe layer and a first Si layer formed thereover by epitaxial growth, a groove which runs through the first Si layer and reaches the SiGe layer; forming thereover a second Si layer; heat treating the substrate to convert a portion of the second Si film, corresponding to a predetermined thickness from the surface, into a first insulating film; forming over the first insulating film a second insulating film to have a thickness sufficient to fill the groove; and removing a portion of the second insulating film outside the groove to form a shallow groove isolation.

Alternatively, prior to the formation of the second Si layer, the bottom and side walls of the groove are subjected to thermal oxidation to form an SiGe oxide film and an Si oxide film. After removal of only the SiGe oxide film by etching, the second Si layer may be formed only over the exposed SiGe layer.

A method of manufacture of a semiconductor integrated circuit device, comprises:

(a) preparing a semiconductor substrate having an SiGe layer and a first Si layer epitaxially grown thereover;

(b) etching the semiconductor substrate to form, in element isolation regions of the semiconductor substrate, grooves which run through the first Si layer and reach the SiGe layer;

(c) forming a second Si layer over the surface of the semiconductor substrate including the bottom and side walls of the grooves;

(d) heat treating the second Si layer to convert a portion of the Si film, corresponding to a predetermined thickness from the surface of the layer, into a first insulating film;

(e) forming, over the first insulating film, a second insulating film having a thickness sufficient to embed the grooves, and removing a portion of the second insulating film outside the grooves to form element isolations formed in the element isolation regions and element formation regions partitioned by the element isolations; and (f) forming a semiconductor element in the element formation regions.

A method of manufacture of a semiconductor integrated circuit device as described above, wherein the second Si layer is a single crystal Si film and the above-described step (c) is a step of forming the single crystal Si film by epitaxial growth.

A method of manufacture of a semiconductor integrated circuit device as described above, wherein the second Si film is a polycrystalline Si film and the above-described step (c) is a step of depositing the polycrystalline Si film over the surface of the semiconductor substrate, including the bottom and side walls of each of the grooves.

A method of manufacture of a semiconductor integrated circuit device as described above, further comprises, between the steps (d) and (e):

(g) forming a nitride film over the first insulating film.

A method of manufacture of a semiconductor integrated circuit device as described above, further comprises, between the step (d) and (e):

(g) forming a nitride film over the first insulating film, and, then, anisotropically etching the nitride film to leave a portion of the nitride film over the side walls of each of the grooves.

A method of manufacture of a semiconductor integrated circuit device as described above, wherein the second insulating film of the step (e) is a silicon oxide film and the silicon oxide film is formed by CVD using ozone and tetraethoxysilane as raw materials.

A method of manufacture of a semiconductor integrated circuit device as described above, wherein the second insulating film of the step (e) is a silicon oxide film and the silicon oxide film is formed by thermal treatment of a film which has been deposited by CVD using ozone and tetraethoxysilane as raw materials.

A method of manufacture of a semiconductor integrated circuit device as described above, wherein the step (f) is a step of forming an MISFET and the step (f) comprises forming, in the element isolation region, a conductive film of the same layer with a gate electrode constituting the MISFET.

A method of manufacture of a semiconductor integrated circuit device as described above, wherein upon completion of the semiconductor integrated circuit device, the second Si layer remains.

A method of manufacture of a semiconductor integrated circuit device, comprises:

(a) preparing a semiconductor substrate having an SiGe layer and a first Si layer epitaxially grown thereover;

(b) etching the semiconductor substrate to form, in element isolation regions of the semiconductor substrate, grooves which run through the first Si layer and reach the SiGe layer;

(c) subjecting the surface of the semiconductor substrate, including the bottom and side walls of each of the grooves, to thermal oxidation to form an SiGe oxide film over the surface of the SiGe layer that is exposed from the bottom and side walls of each of the grooves, and forming an Si oxide film over the surface of the Si layer that is exposed from the side walls of each of the grooves;

(d) etching the SiGe oxide film at a higher selectivity relative to that of the Si oxide film to expose the SiGe layer from the bottom and side walls of each of the grooves;

(e) forming by epitaxial growth a second single crystal Si layer over the surface of the SiGe layer exposed by the step (d);

(f) heat treating the second Si layer to convert a portion of the Si film, corresponding to a predetermined thickness from the surface of the layer, into a first insulating film;

(g) forming over the first insulating film, a second insulating film having a sufficient thickness to embed the grooves, and removing a portion of the second insulating film outside the grooves to form element isolations formed in the element isolation regions and element formation regions partitioned by the element isolations; and (h) forming a semiconductor device in the element formation regions.

DETAILED DESCRIPTION OF THE PREFERRED EMBODIMENTS

Figure 1:
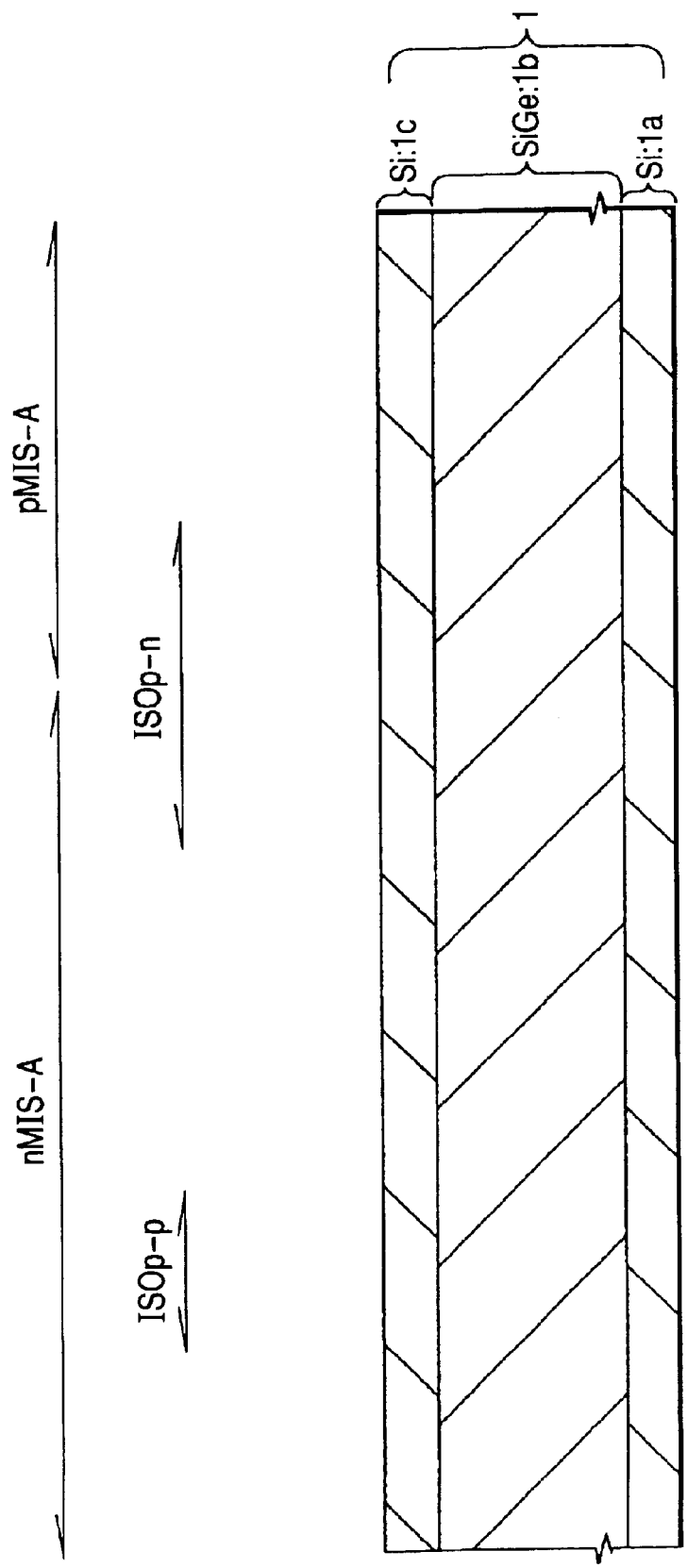
FIG. 1 is a fragmentary cross-sectional view of a substrate illustrating a step in the method of manufacture of a semiconductor integrated circuit device according to Embodiment 1 of the present invention.

Embodiments of the present invention will be described hereinafter specifically based on the accompanying drawings. In all of the drawings, elements having a like function will be identified by like reference numerals, and overlapping descriptions thereof will be omitted.

(Embodiment 1)

A semiconductor integrated circuit device according to this Embodiment will be described in the sequence of its manufacturing steps.

FIGS. 1 to 13 are each a fragmentary cross-sectional view of a substrate illustrating a respective step in the method of manufacture of a semiconductor integrated circuit device according to this Embodiment. FIG. 14 is a fragmentary plan view of the substrate, and each cross-sectional view is a view taken along a line A—A of the plan view. The region nMIS-A is the region where an n-channel type MISFET is formed, while the region pMIS-A is the region where a p-channel type MISFET is formed.

First, a semiconductor substrate (which will hereinafter be called "substrate", simply) is formed, having, as illustrated in FIG. 1, a single crystal silicon (Si) layer $1a$, an SiGe (silicon germanium) layer $1b$, and a single crystal Si layer $1c$ epitaxially grown thereover.

This substrate 1 is formed as follows. First, a SiGe layer $1b$ of about 5 $\mu$m thick is formed over the surface of the single crystal Si substrate $1a$ by epitaxial growth while using Si and Ge at a composition ratio (Si:Ge) of, for example, 0.8:0.2. Then, a Si layer $1c$ of about 0.02 $\mu$m is formed over the SiGe layer $1b$ by epitaxial growth.

A tensile stress is applied to the Si layer $1c$ of the substrate 1. The lattice spacing of the SiGe layer $1b$ is wider than that of the single crystal Si so that the Si layer grown over the SiGe layer $1b$ has a widened lattice spacing, influenced by that of the SiGe layer. Although this widening of the lattice spacing is relaxed as the growth of the film proceeds, a tensile stress is applied to the Si layer $1c$, and the mobility of the carriers increases when the lattice spacing of the Si layer is wider than that of the general Si crystal over the surface of the substrate. It is only necessary for a layer underlying the Si layer 1c to have crystals wider in lattice spacing than Si and which permits epitaxial growth of Si from the surface of the layer. This substrate 1 is called a "strained substrate", while the Si layer 1c is called a "strained layer".

Figure 2:
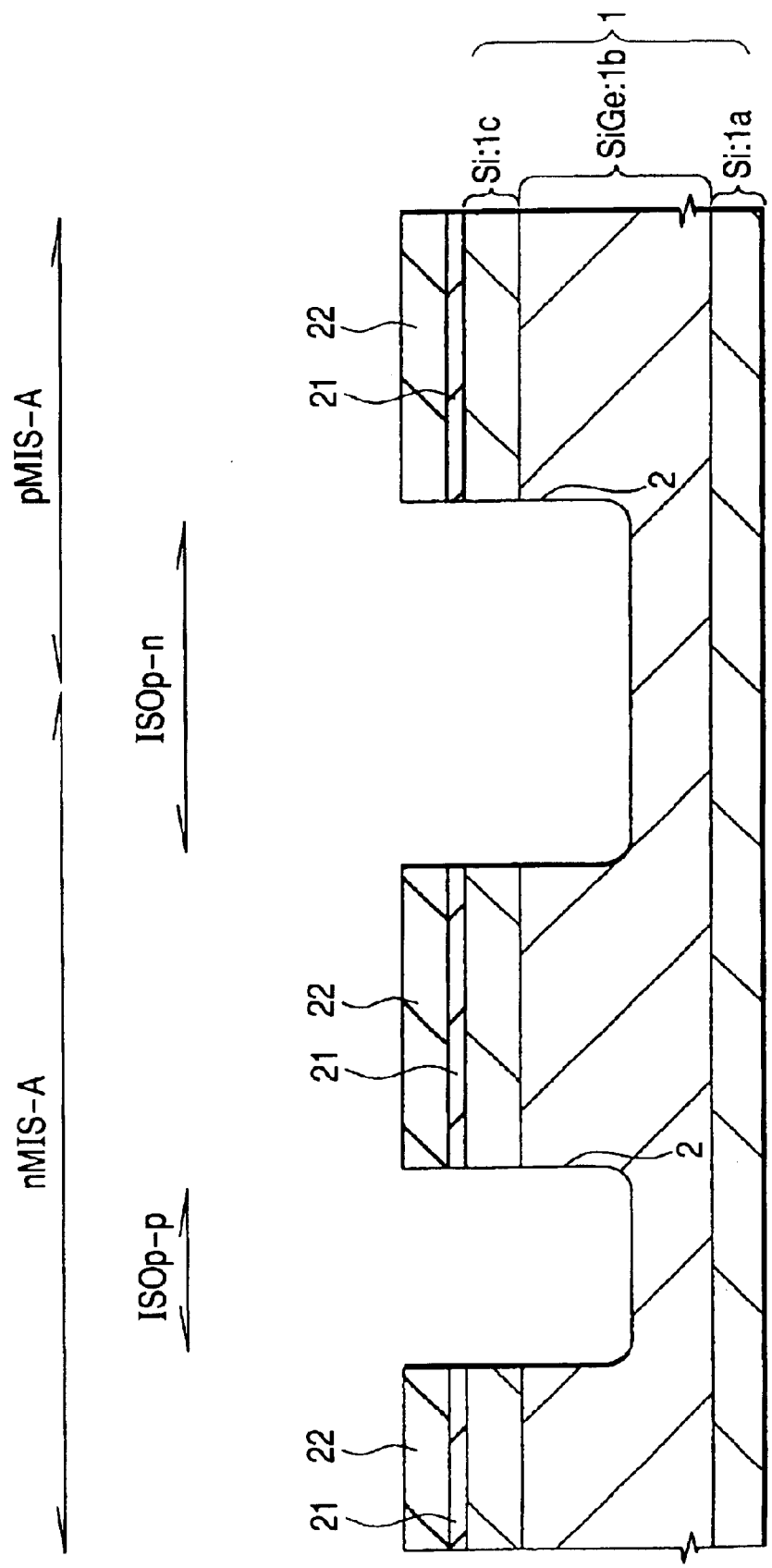
FIG. 2 is a fragmentary cross-sectional view of a substrate illustrating a step in the method of manufacture of the semiconductor integrated circuit device according to Embodiment 1 of the present invention.

A shallow groove isolation SGI, serving as an element isolation, is then formed in the substrate 1. This shallow groove isolation SGI is formed, as illustrated in FIG. 2, by forming a silicon oxide film 21 that is about 10 nm thick over the surface of the substrate 1, and, then, depositing a silicon nitride film 22 of about 150 nm over the silicon oxide film.

Using an unillustrated photoresist film (which will hereinafter simply be called a "resist film") as a mask, the silicon nitride film 22 and silicon oxide film 21 are removed from the element isolation regions (ISOp-p, ISOp-n) of the substrate 1.

After removal of the resist film, the substrate 1 is etched, using the silicon nitride film 22 as a mask, to form a groove 2. The groove 2 must have a depth of about 300 nm in this case in order to maintain element isolating properties. This groove 2 extends through the Si layer 1c and reaches the SiGe layer 1b. The bottom of the groove 2 exists in the SiGe layer 1b.

Accordingly, the Si layer 1c and SiGe layer 1b are exposed from the side walls of the groove 2, while the SiGe layer 1b is exposed from the bottom of the groove 2.

Figure 3:
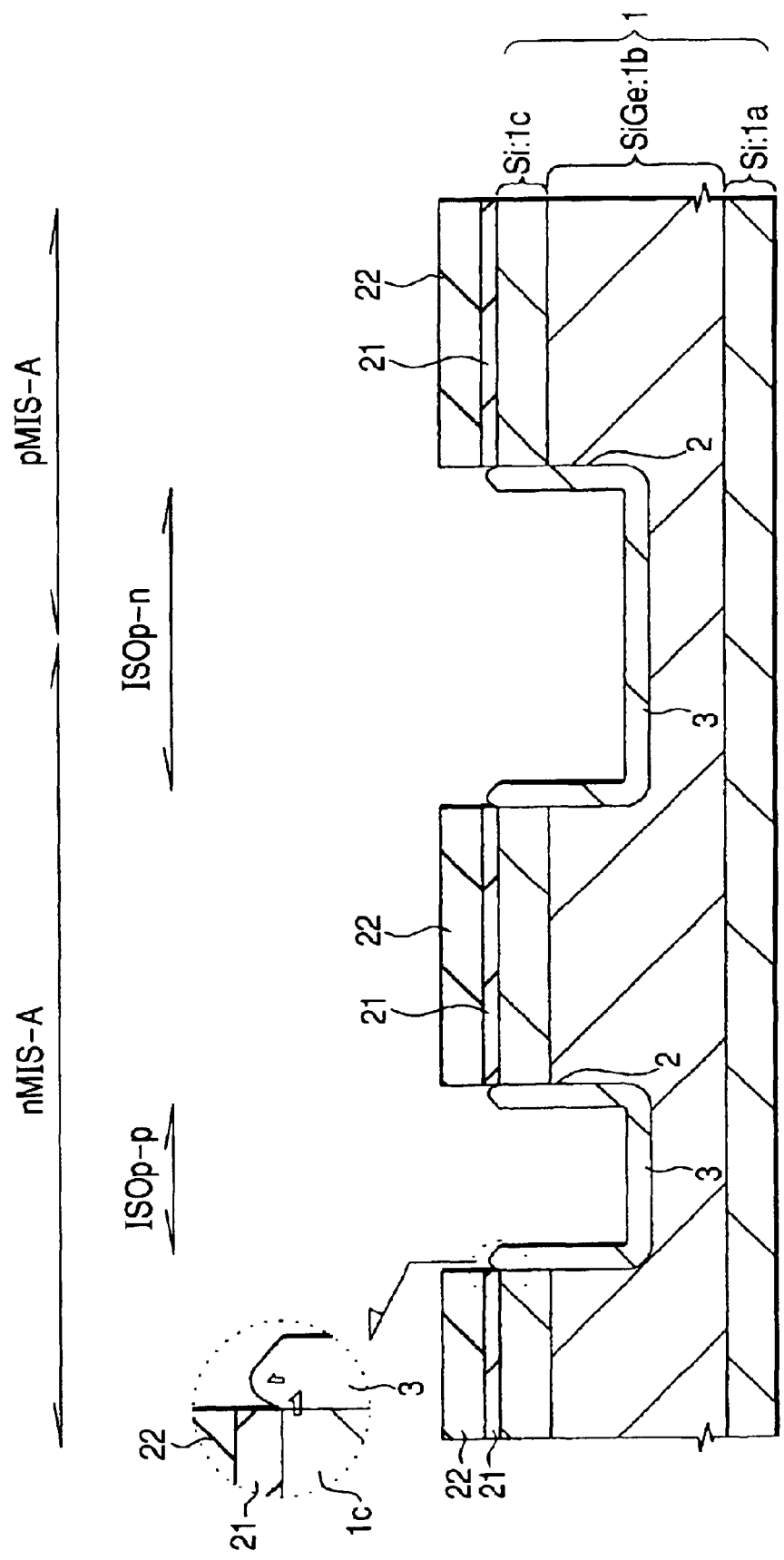
FIG. 3 is a fragmentary cross-sectional view of a substrate illustrating a step in the method of manufacture of the semiconductor integrated circuit device according to Embodiment 1 of the present invention.

Reduction, for example, heat treatment in a hydrogen atmosphere, is then conducted to remove a natural oxide film from the surface of the groove 2. As illustrated in FIG. 3, single crystal Si is epitaxially grown over the Si layer 1c and SiGe layer 1b of the side walls of the groove and over the SiGe layer 1b of the bottom of the groove 2, whereby a single crystal Si film 3 that is about 20 nm thick is formed. At the upper portion of the side walls of the groove 2, single crystal Si grows not only horizontally, but also vertically, relative to the surface of the substrate, which means that there is growth of single crystal Si to form a protrusion, at the upper portion of the side walls of the groove, from the surface of the substrate 1.

Next, an Si oxide film (thermal oxide film) 6 is to be formed by oxidizing the surface of the Si film 3 on the inside wall of the groove 2. Prior thereto, the silicon oxide film 21 is selectively etched to cause it to retreat from the side walls of the groove, as illustrated in FIG. 4.

Figure 5:
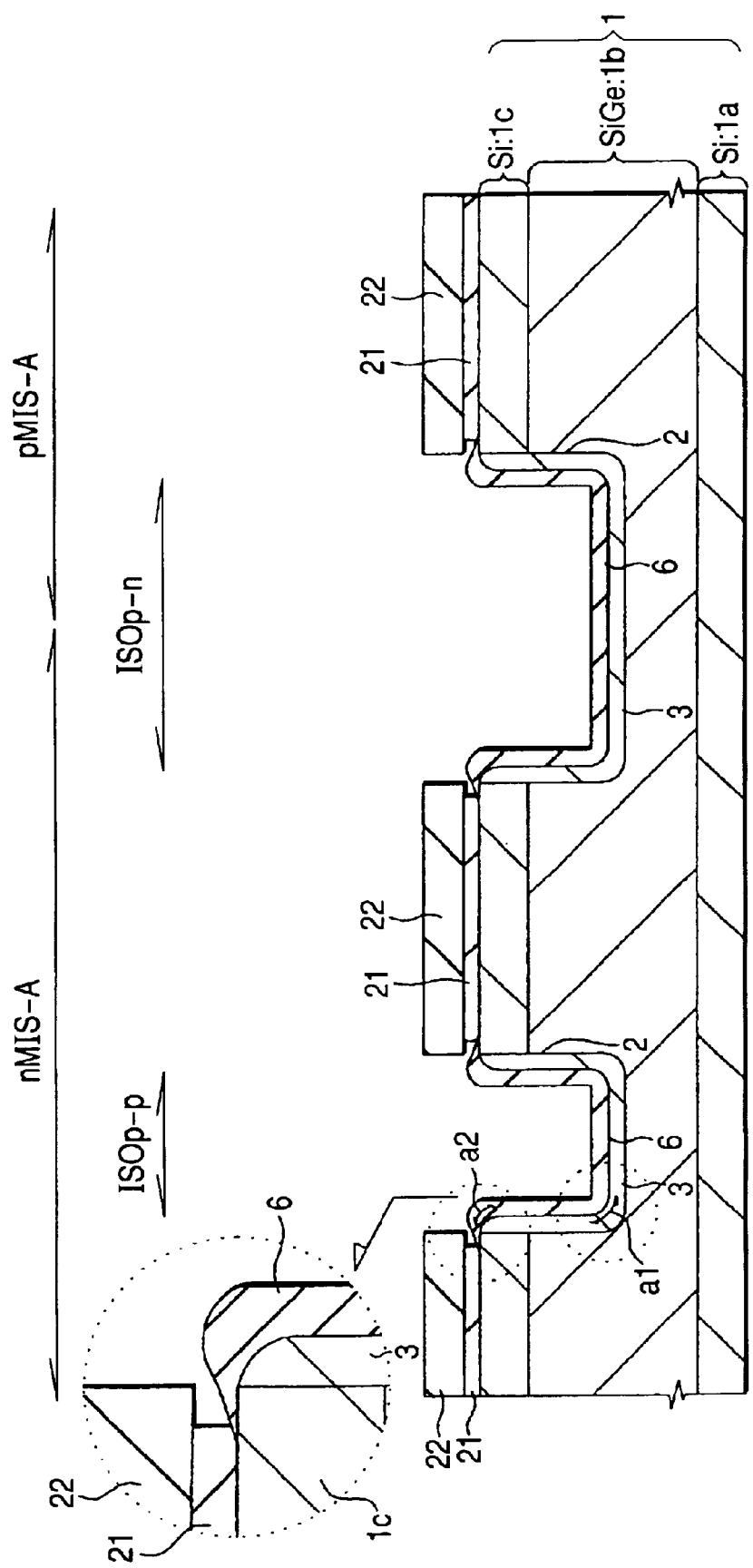
FIG. 5 is a fragmentary cross-sectional view of a substrate illustrating a step in the method of manufacture of the semiconductor integrated circuit device according to Embodiment 1 of the present invention.

As illustrated in FIG. 5, the surface of the Si film 3 on the inside wall of the groove 2 is oxidized to form an Si oxide film (thermal oxide film) 6. This Si oxide film 6 is formed for the purpose of (1) suppressing generation of crystal defects which will otherwise occur owing to stress concentration to a corner portion (a1) on the bottom of the groove by rounding the Si oxide film 6 on the corner portion; and (2) suppressing fluctuations in the characteristics of a semiconductor element, which will otherwise occur owing to electric field concentration to a corner portion (a2) at the upper portion of the side walls of the groove, by rounding the Si oxide film 6 on the corner portion. When a CVD insulating film to be embedded inside of the groove is brought into direct contact with the Si layer (1a), the interface state density increases. The Si oxide film (thermal oxide film) 6, which is capable of suppressing the interface state density even if they are brought into contact, is interposed (3) for the purpose of keeping an increase in interface state density small.

Figure 4:
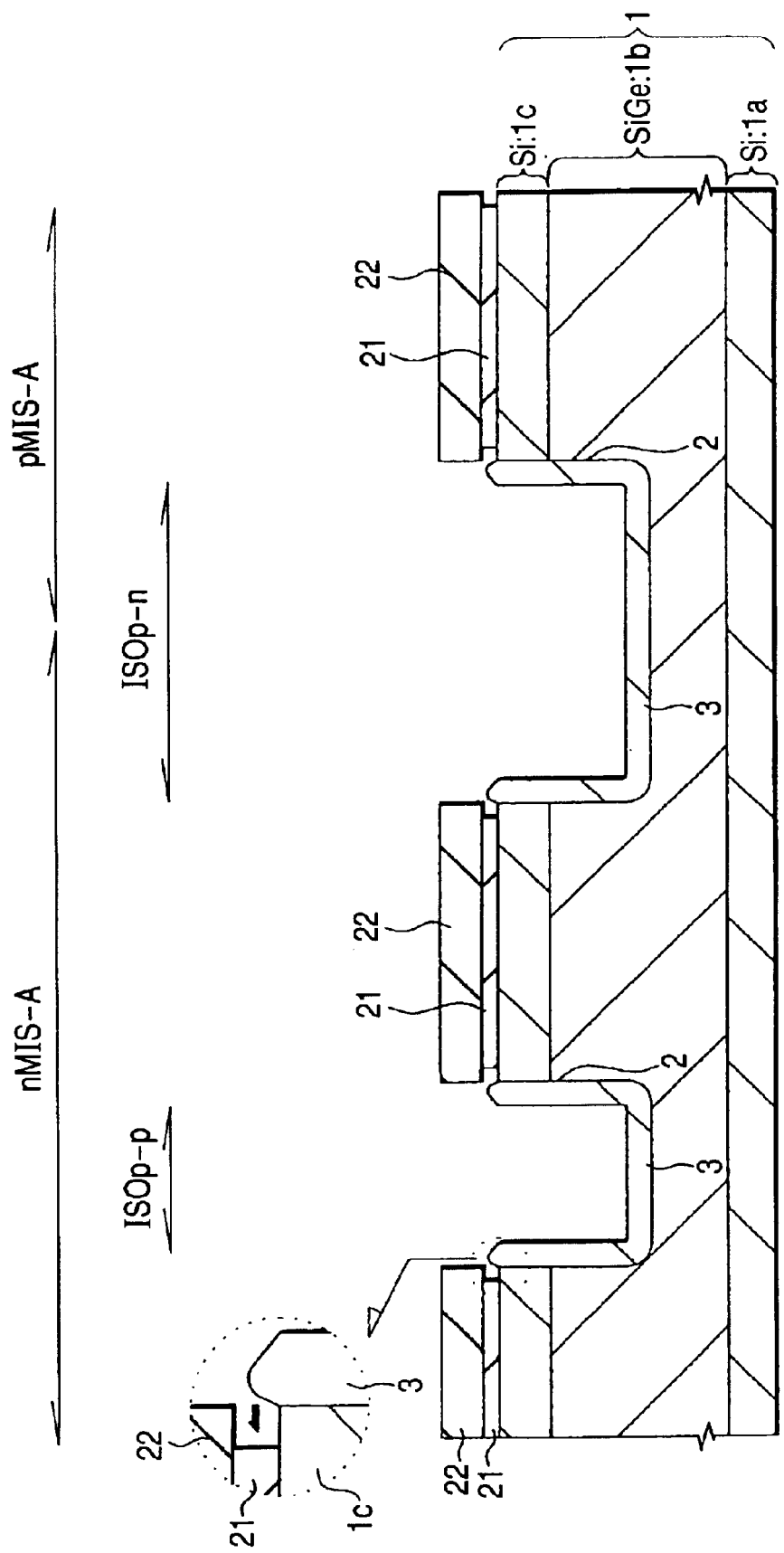
FIG. 4 is a fragmentary cross-sectional view of a substrate illustrating a step in the method of manufacture of the semiconductor integrated circuit device according to Embodiment 1 of the present invention.

According to this Embodiment, oxidation is conducted after the silicon oxide film 2 has retreated from the side wall portions of the groove 2 (FIG. 4). This makes it possible to enlarge the bird's beak and ease the angle of the corner, whereby the electric field concentration can be relaxed further.

With this oxidation, a portion of the Si film 3 corresponding to a predetermined thickness from its surface is oxidized so that the Si film 3 partly remains even after oxidation. For example, since oxidation of Si forms an Si oxide film having twice as much volume as that of Si, oxidation of 10 nm of the Si film 3, having a thickness of 20 nm, forms a Si oxide film 6 that is about 20 nm in thickness and leaves a Si film 3 that is about 10 nm thick.

Figure 6:
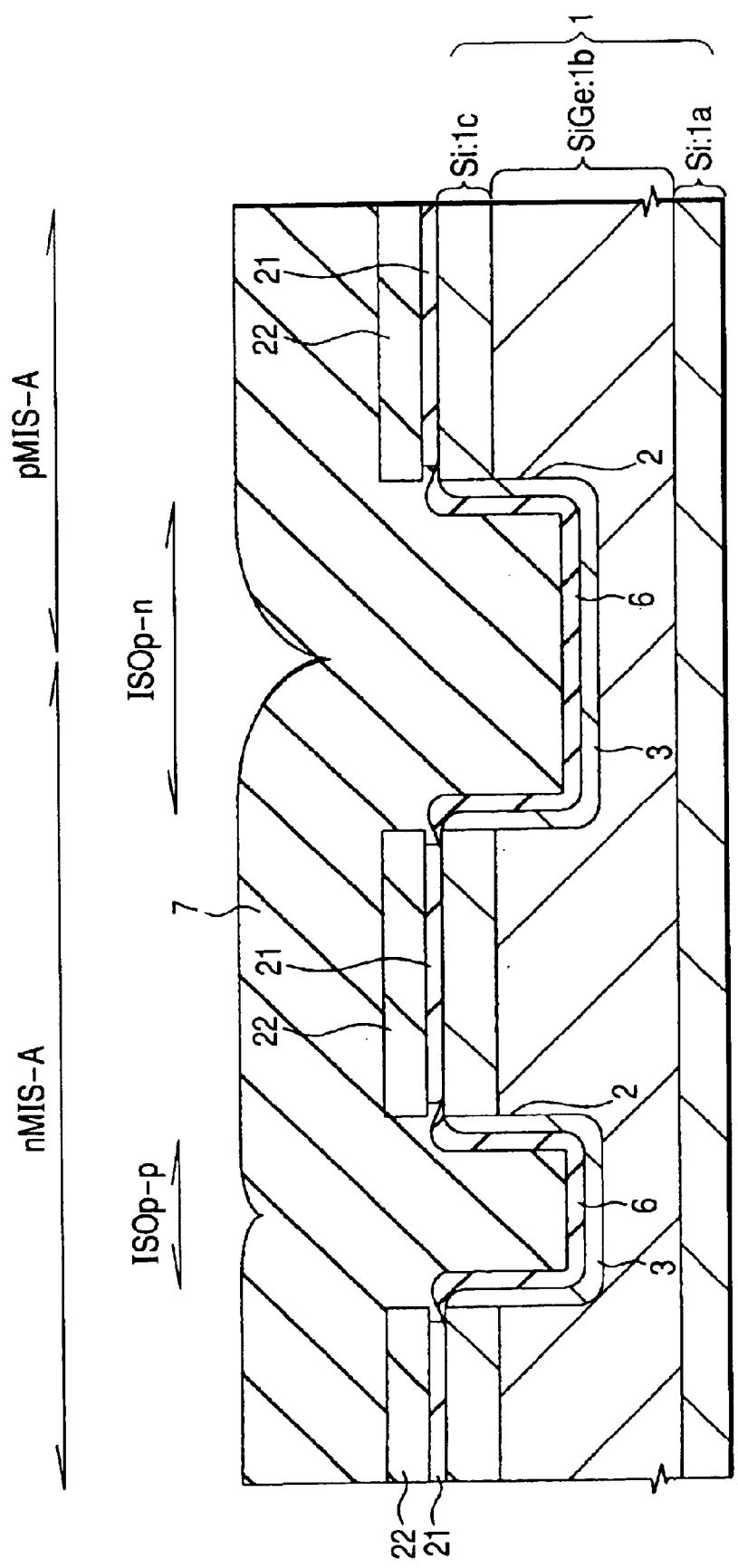
FIG. 6 is a fragmentary cross-sectional view of a substrate illustrating a step in the method of manufacture of the semiconductor integrated circuit device according to Embodiment 1 of the present invention.

As illustrated in FIG. 6, a silicon oxide film 7 is deposited as an insulating film by CVD (Chemical Vapor Deposition) over the substrate 1 including the inside (over the Si oxide film 6) of the groove 2. This silicon oxide film can be formed, for example, by CVD using tetraethoxysilane (Si $(OC_2H_5)_4$) and ozone ($O_3$) as raw materials. Such a film is referred to as an "ozone TEOS ($O_3$-TEOS) film". The $O_3$-TEOS film is then heat treated (densified) to remove impurities therefrom to obtain a dense film. The method of formation of the silicon oxide film 7 is not limited to the above-described one, but HDP (High Density Plasma) CVD can be employed instead. This method does not need densification.

Figure 7:
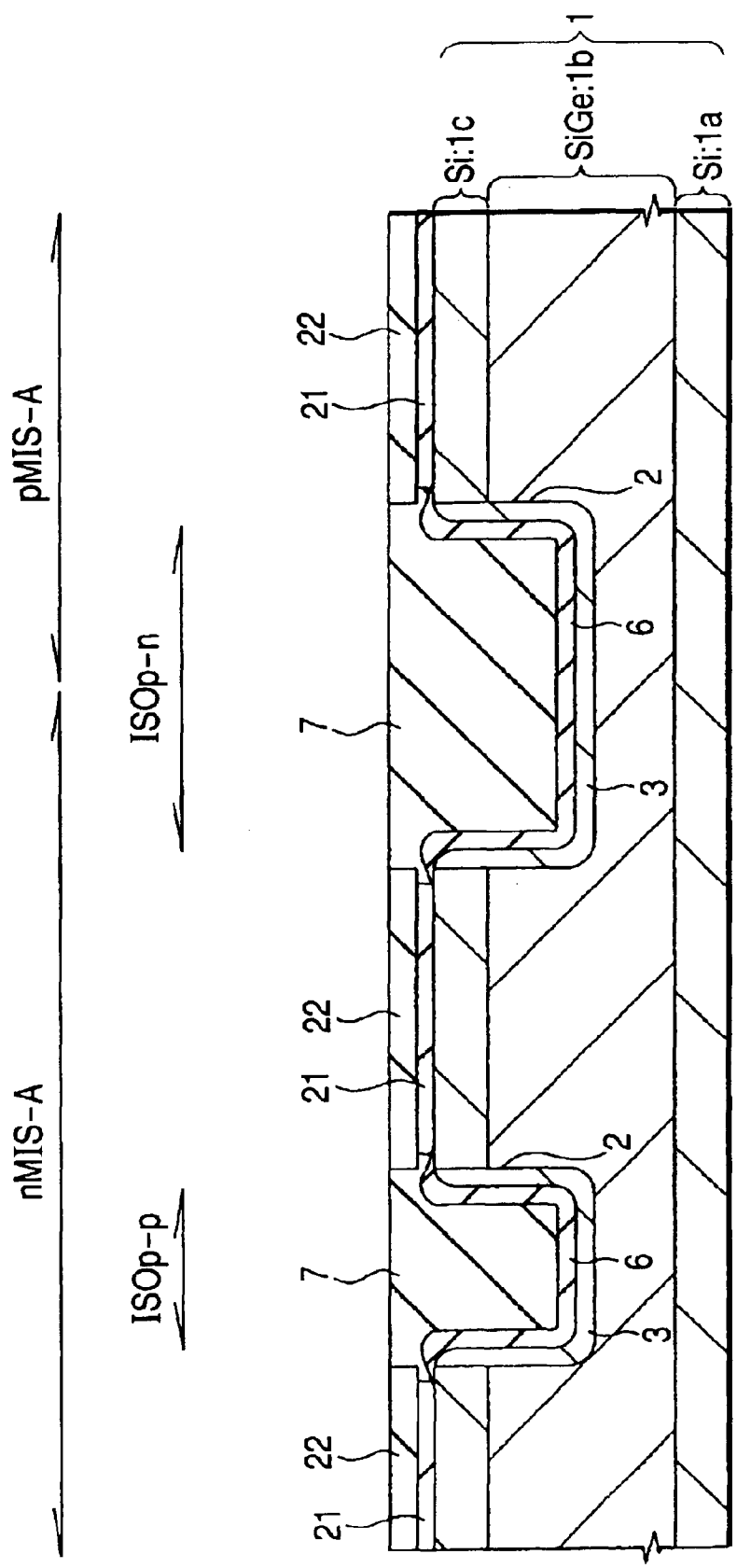
FIG. 7 is a fragmentary cross-sectional view of a substrate illustrating a step in the method of manufacture of the semiconductor integrated circuit device according to Embodiment 1 of the present invention.

As illustrated in FIG. 7, the silicon oxide film 7 is polished, for example, by CMP (Chemical Mechanical Polishing) until the silicon nitride film 22 is exposed therefrom, whereby the surface of the silicon oxide film is planarized.

Figure 8:
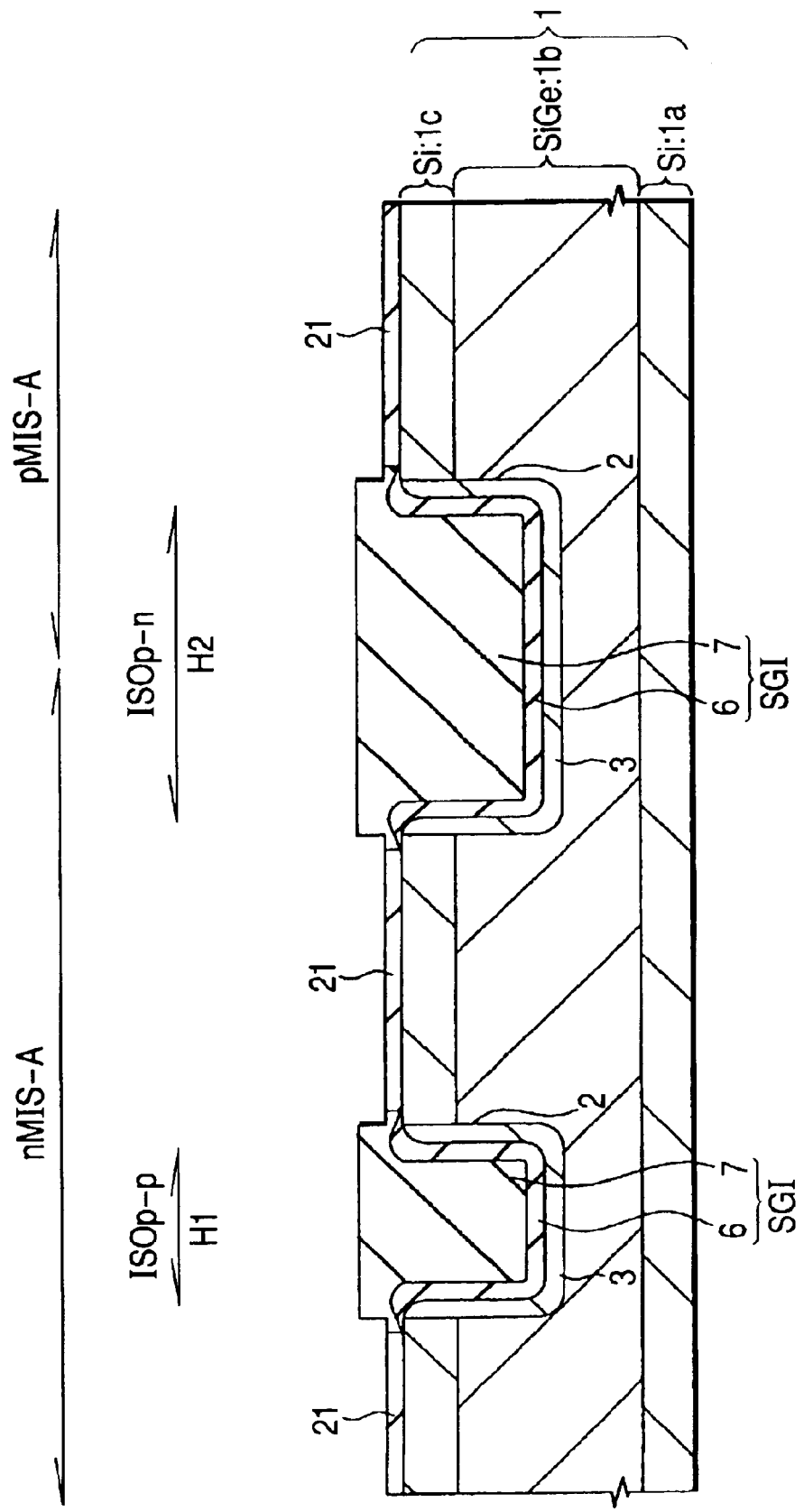
FIG. 8 is a fragmentary cross-sectional view of a substrate illustrating a step in the method of manufacture of the semiconductor integrated circuit device according to Embodiment 1 of the present invention.

As illustrated in FIG. 8, the silicon nitride film 22 is removed. As a result, the Si film 3 on the inside wall of the groove 2 and a shallow groove isolation SGI, made of the Si oxide film 6 and silicon oxide film 7, are completed. A region surrounded by this shallow groove isolation SGI becomes an element formation region (refer to FIG. 14). After the removal of the silicon nitride film 22, the silicon oxide film 7 on the surface of the shallow groove isolation SGI protrudes from the surface of the substrate 1, but this protrusion of the shallow groove isolation SGI disappears gradually in the subsequent steps, such as cleaning of the substrate and removal of the thermal oxide film.

With regard to the shallow groove isolation SGI, the width H2 of the shallow groove isolation on the boundary between an n channel type MISFET formation region (nMIS-A) and a p channel type MISFET formation region (pMIS-A) is greater than the width H1 of the shallow groove isolation in the n-channel MISFET formation region (nMIS-A). The shallow groove isolation having a width H1 will be an isolation in a p type well 4p, which will be described later, so that it is referred to as an "intra-well isolation (ISOp-p)", while that having the width H2 will be an isolation between the p type well 4p and an n type well 4n, so that it is called a "well-well isolation (ISOn-p)". The width H1 of the intra-well isolation is about 0.2 μm, while the width H2 of the well-well isolation is about 0.4 μm.

Figure 9:
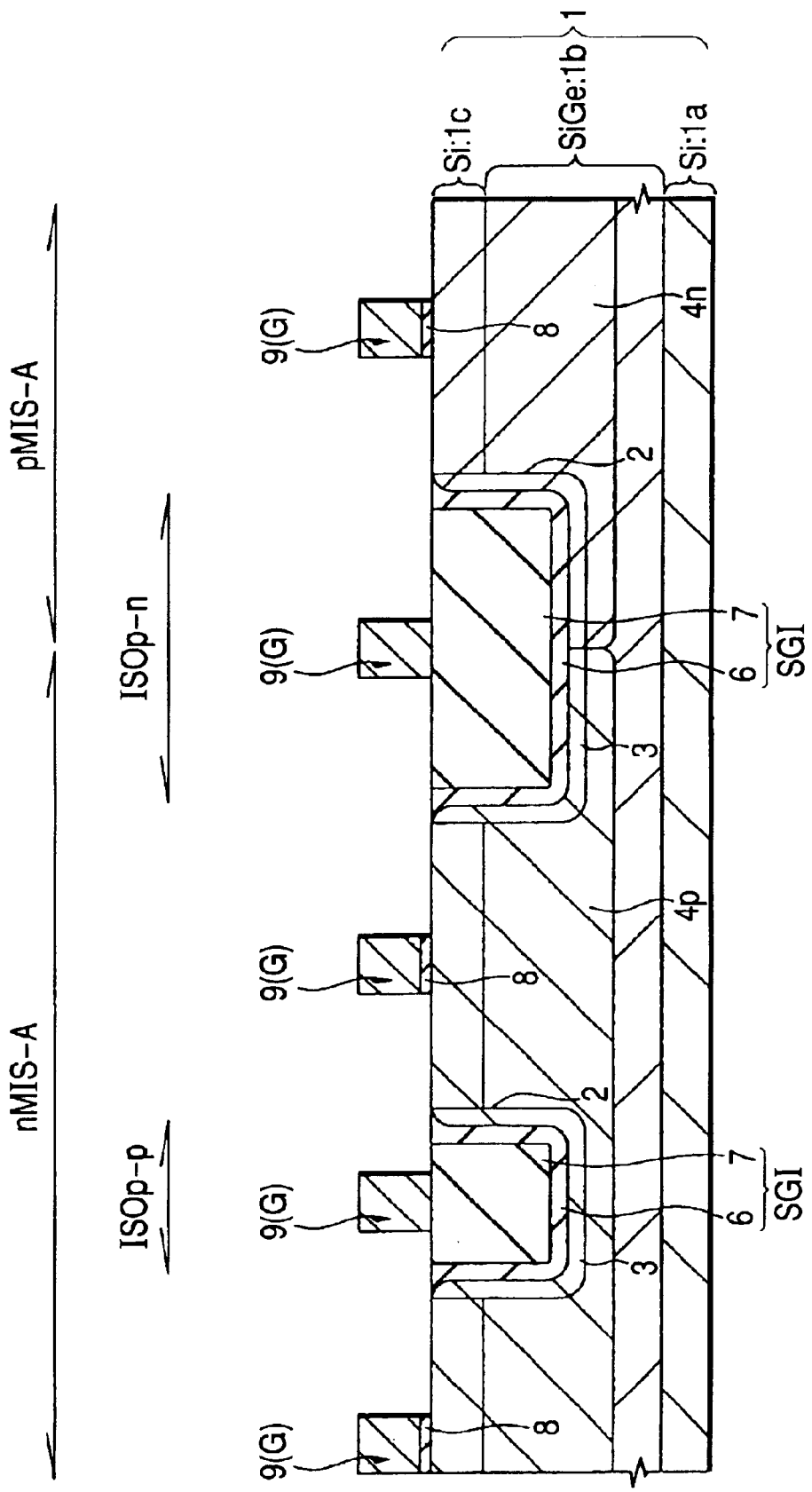
FIG. 9 is a fragmentary cross-sectional view of a substrate illustrating a step in the method of manufacture of the semiconductor integrated circuit device according to Embodiment 1 of the present invention.

As illustrated in FIG. 9, for example, boron is ion-implanted as a p type impurity at a dose of about $2 \times 10^{13}$ cm$^{-2}$ in the n channel MISFET formation region (nMIS-A) of the substrate 1. In the p channel MISFET formation region (pMIS-A) of the substrate 1, on the other hand, phosphorus is ion-implanted as an n type impurity at a dose of about $2 \times 10^{13}$ cm$^{-2}$. Heat treatment is then conducted to diffuse these impurities, whereby n type well 4n and p type well 4p are formed. The n type well 4n and p type well 4p each has a depth of about 450 nm, and the n type well 4n and p type well 4p each has a bottom in the SiGe layer 1b. The bottom of the n type well 4n and p type well 4p exist at a position deeper than the bottom of the shallow groove isolation SGI. In this case, the well has a maximum concentration of about $2 \times 10^{18}$ cm$^{-3}$.

After wet cleaning of the surface of the substrate 1 (p type well 4p and n type well 4n) with, for example, a hydrofluoric acid detergent, a gate oxide film (gate insulating film) 8 that is about 2 nm thick is formed on the surface of each of the p type well 4p and n type well 4n by thermal oxidation.

Over the gate oxide film 8, a low resistance polycrystalline silicon film 9 that is about 150 nm thick is formed as a conductive film by CVD. Then, using an unillustrated film as a mask, the polycrystalline silicon film 9 is etched to form a gate electrode G.

A gate electrode G is also formed over the shallow groove isolations SGI (ISOp-p, ISOp-n). A gate electrode over another un-illustrated element formation region may extend even over the shallow groove isolation SGI. The polycrystalline silicon film (9), which is in the same layer with the gate electrode G, may be formed over the shallow groove isolation as an interconnect or resistor.

Figure 10:
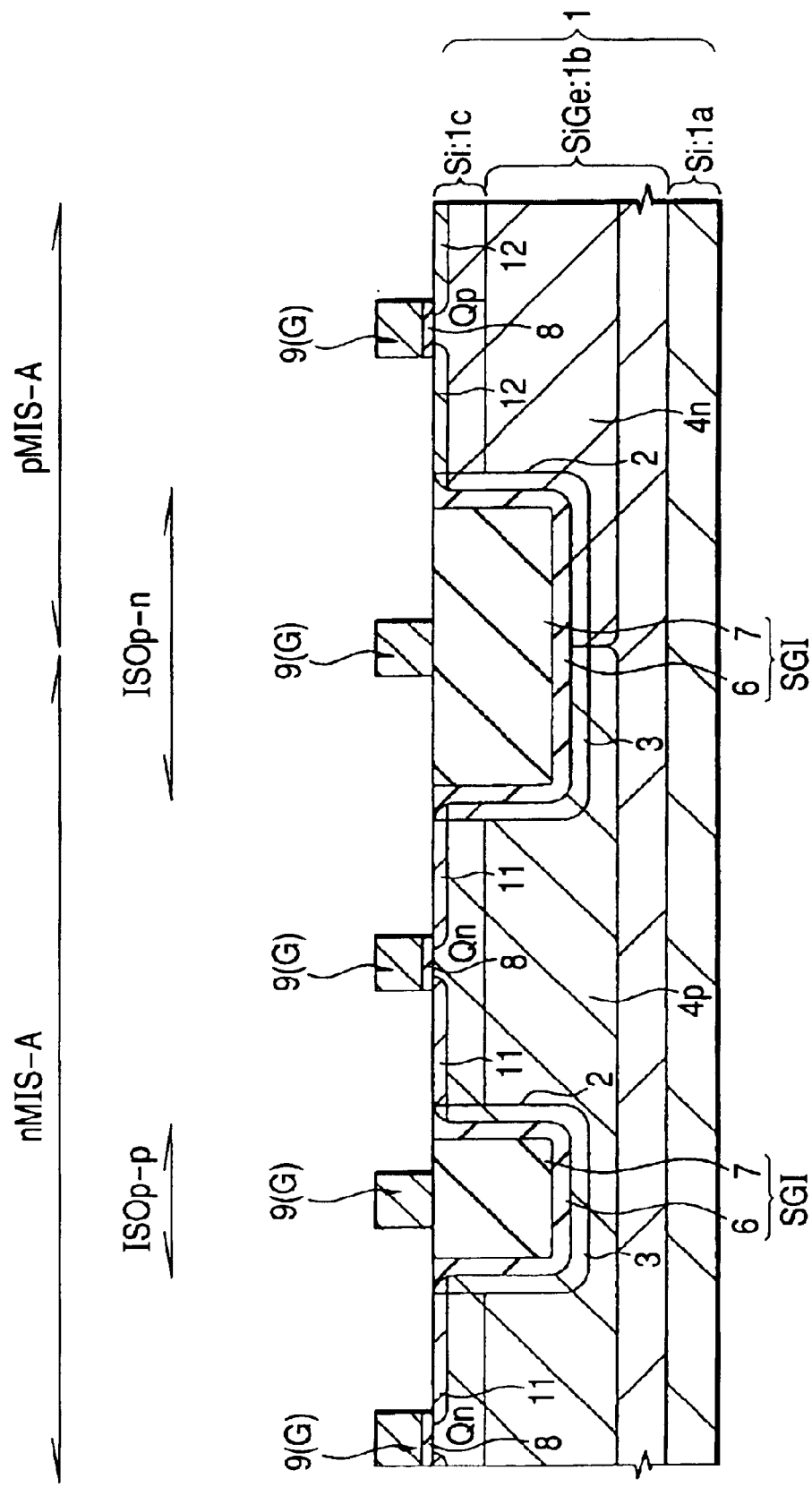
FIG. 10 is a fragmentary cross-sectional view of a substrate illustrating a step in the method of manufacture of the semiconductor integrated circuit device according to Embodiment 1 of the present invention.

As illustrated in FIG. 10, for example, arsenic (As) is implanted as an n type impurity to both sides of the gate electrode G of the p type well 4p, whereby n$^-$ type semiconductor regions 11 are formed. In a similar manner, a p type impurity is implanted to both sides of the gate electrode G of the n type well 4n, whereby p$^-$ type semiconductor regions 12 are formed.

Figure 11:
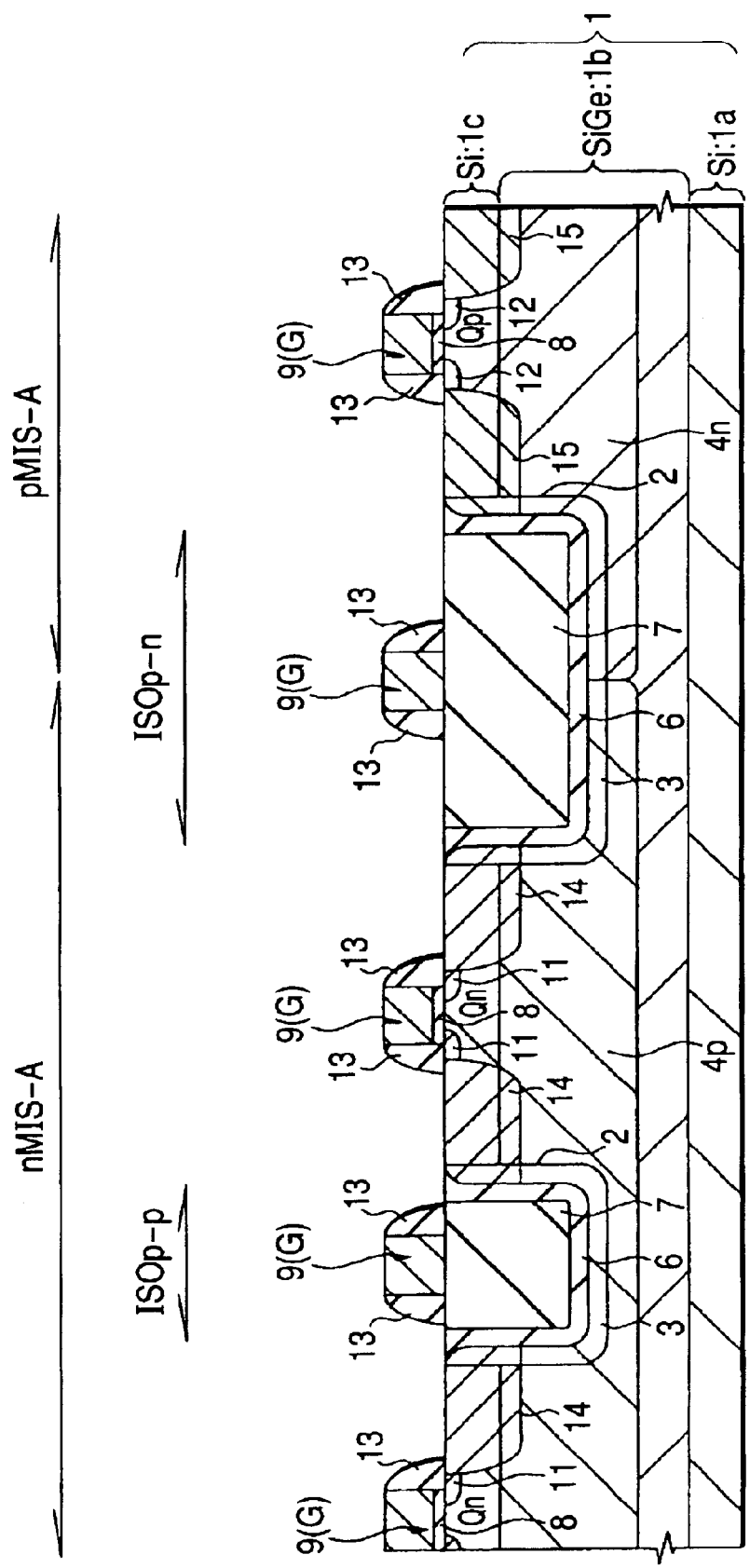
FIG. 11 is a fragmentary cross-sectional view of a substrate illustrating a step in the method of manufacture of the semiconductor integrated circuit device according to Embodiment 1 of the present invention.

As illustrated in FIG. 11, a silicon nitride film that is about 70 nm thick is deposited over the substrate 1 by CVD, followed by anisotropic etching to form side wall spacers 13 that are about 50 nm thick over the side walls of the gate electrode G.

Then, for example, arsenic is implanted as an n type impurity to both sides of the gate electrode G over the p type well 4p, and, for example, boron fluoride is implanted as a p type impurity to both sides of the gate electrode G over the n type well 4n, followed by heat treatment at 1000° C. for 1 second to activate these impurities, whereby n$^+$ type semiconductor regions 14 and p$^+$ type semiconductor regions 15 (source, drain) are formed.

These n$^+$ type semiconductor regions 14 and p$^+$ type semiconductor regions 15 (source, drain) extend even to the SiGe layer 1b. These regions may have a bottom in the Si layer 1c by reducing their depth. To enlarge the tensile stress of the Si layer 1c, however, a decrease in the thickness of the Si layer 1c as much as possible is desired. In such a case, the n$^+$ type semiconductor regions 14 and p$^+$ type semiconductor regions 15 (source and drain) will extend to the SiGe layer 1b.

By the steps so far described, an N channel type MISFETQn and a p channel type MISFETQp having an LDD (Lightly Doped Drain) structure and being equipped with sources and drains (n$^-$ type semiconductor regions, n$^+$ type semiconductor regions, p$^-$ type semiconductor regions, and p$^+$ type semiconductor regions) are formed. FIG. 14 is a fragmentary cross-sectional view of a substrate of the semiconductor integrated circuit device according to this Embodiment.

In this Embodiment, the MISFET is formed over the strained substrate 1, so that the mobility of electrons in a channel region can be improved, which results in an improvement in the current driving capacity of the MISFET, particularly, the current driving capacity of the n channel type MISFET.

In this Embodiment, the Si film 3 is formed between the shallow groove isolation SGI and the SiGe layer 1b so that the interface state density on the interface between the shallow groove isolation SGI and Si film 3 can be reduced, leading to a reduction in the leakage current flowing via the interface.

Figure 15:
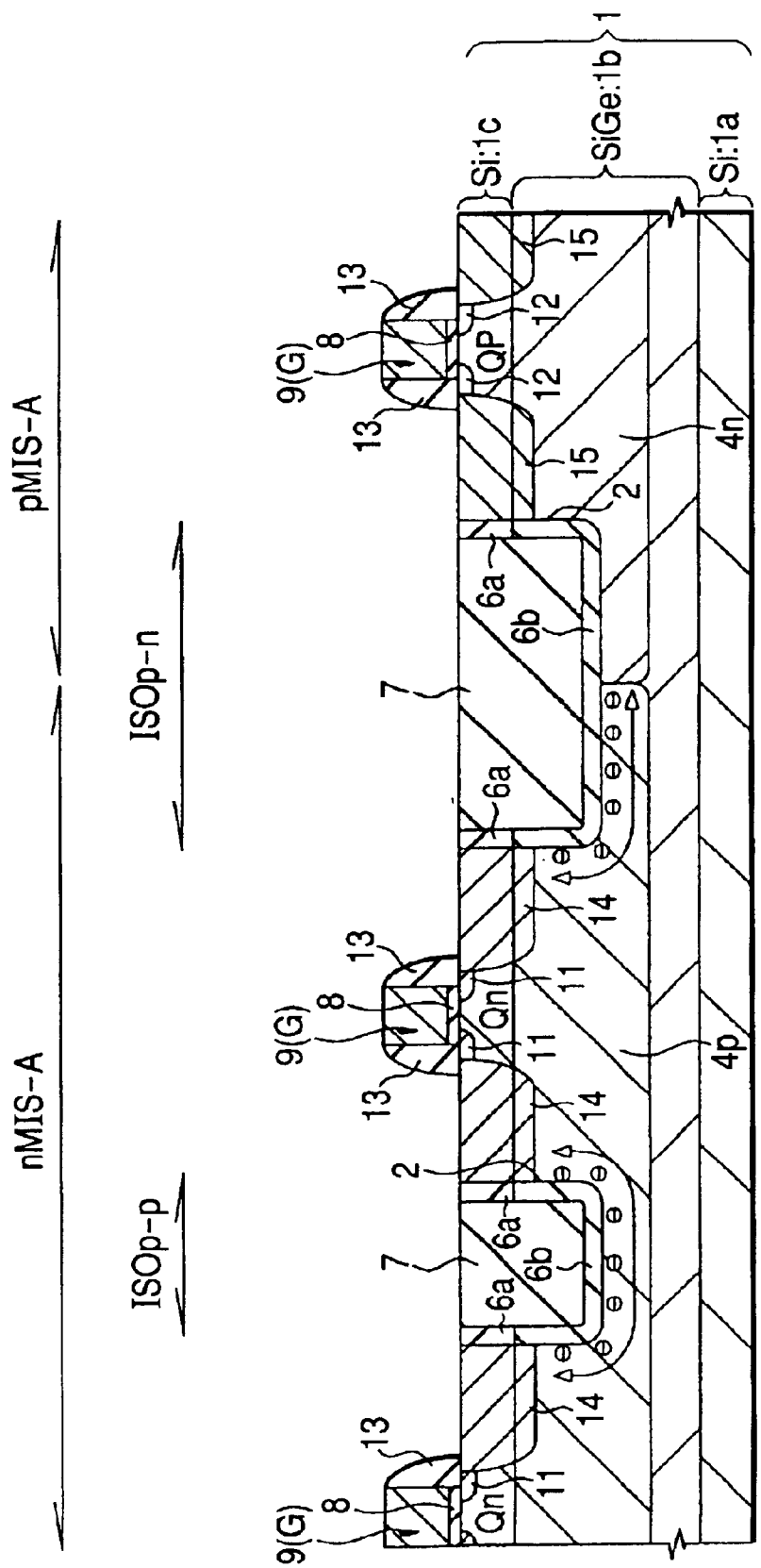
FIG. 15 is a fragmentary cross-sectional view of a substrate of the semiconductor integrated circuit device illustrating an advantage of Embodiment 1 of the present invention.

As illustrated in FIG. 15, it is possible to form an Si oxide film 6a and an SiGe oxide film 6b by directly oxidizing the side walls and bottom of the groove 2. Considering that the SiGe oxide film 6b has an interface state density of about one order of magnitude greater than that of the Si oxide film, direct oxidization of the inside wall of the groove 2 is insufficient as a countermeasure against leakage current. In other words, as illustrated in FIG. 15, electrons become apt to be trapped around the shallow groove isolation (SiGe oxide film 6b), which causes a leakage current to flow along the wall of the shallow groove isolation.

According to this Embodiment, on the other hand, no SiGe oxide film 6b exists on the interface between the shallow groove isolation SGI and the SiGe layer 1b, so that the leakage current can be reduced. In addition, contact between the CVD insulating film (7) and the substrate can be avoided by the Si oxide film 6, which is formed by oxidizing the Si film 3, which has been formed over the inside wall of the groove 2, whereby an interface state density between them can be reduced.

Since the Si film 3 is left on the inside wall of the groove 2 even after the formation of the Si oxide film 6, contact does not occur between the Si oxide film 6 and the SiGe layer 1b, whereby the interface state density therebetween can be reduced.

Even if the Si oxide film 6 is oxidized further by the heat treatment after formation of the Si oxide film 6, for example, densification of the O$_3$-TEOS film (7) or activation of impurities constituting the source and drain (14 and 15), the remaining Si film 3 is oxidized as needed, whereby the oxidation of the SiGe layer 1b can be prevented. This leads to suppression of a rise in the interface state density, which will otherwise occur by the existence of the SiGe oxide film.

Figure 16:
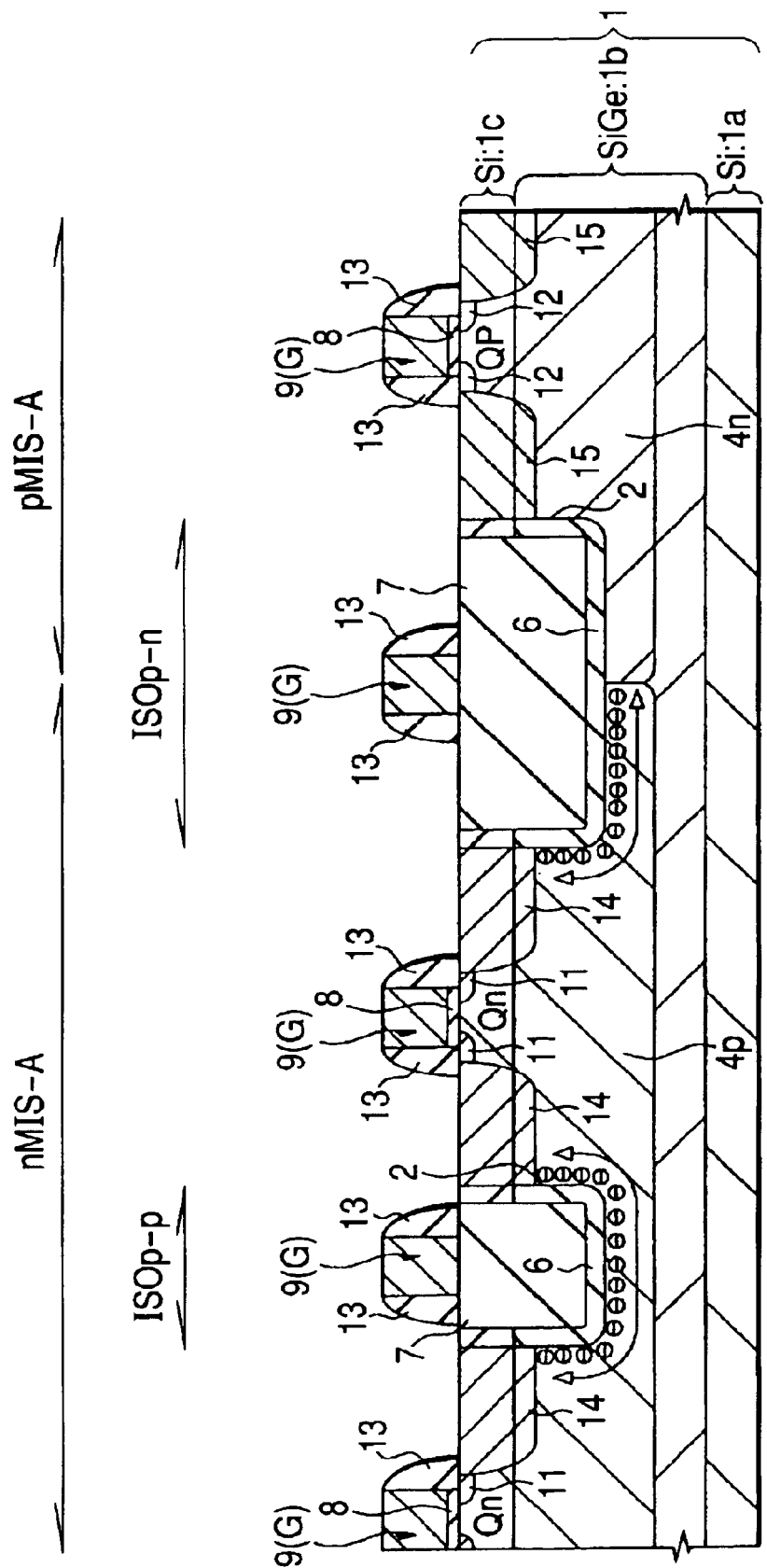
FIG. 16 is a fragmentary cross-sectional view of a substrate of the semiconductor integrated circuit device illustrating another advantage of Embodiment 1 of the present invention.

As in this Embodiment, when the well has a relatively high concentration (for example, 1×10$^{18}$ cm$^{-3}$ or greater) or a conductive film (gate electrode) is formed over the shallow groove isolation, electrons are apt to be trapped at the periphery of the shallow groove isolation SGI, as illustrated in FIG. 16.

Over the shallow groove isolation, a parasitic MOS transistor is formed by the conductive film (gate electrode) and shallow groove isolation SGI. When a potential is applied to the conductive film, electrons are accumulated on the outside wall of the shallow groove isolation, and application of a potential exceeding a threshold potential (Vt) of the parasitic MOS to the conductive film turns the parasitic MOS transistor on. It is generally known that the higher the well concentration, the higher will be the interface state density of a thermal oxide film formed thereover.

This Embodiment is therefore more effective when used in such a case (where the well has a relatively high concentration, or the gate electrode is formed over the shallow groove isolation).

Figure 17:
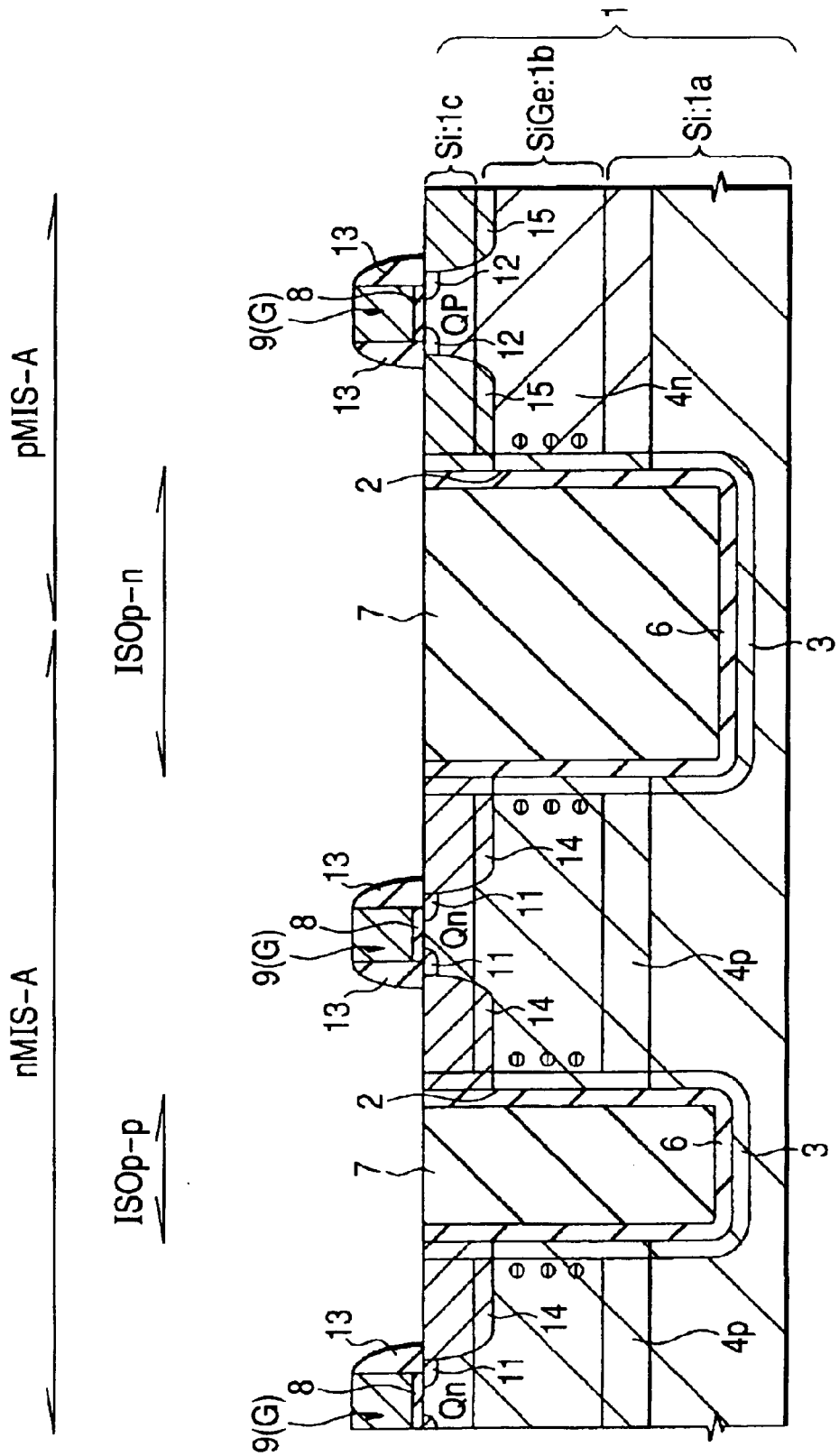
FIG. 17 is a fragmentary cross-sectional view taken along line A—A in FIG. 18.

As illustrated in FIG. 17, even if the shallow groove isolations SGI (6 and 7) are surrounded, at the periphery thereof, with the Si film 3, a channel for leakage current is limited when the shallow groove isolation SGI has a bottom at a position deeper than the SiGe layer 1b.

Figure 18:
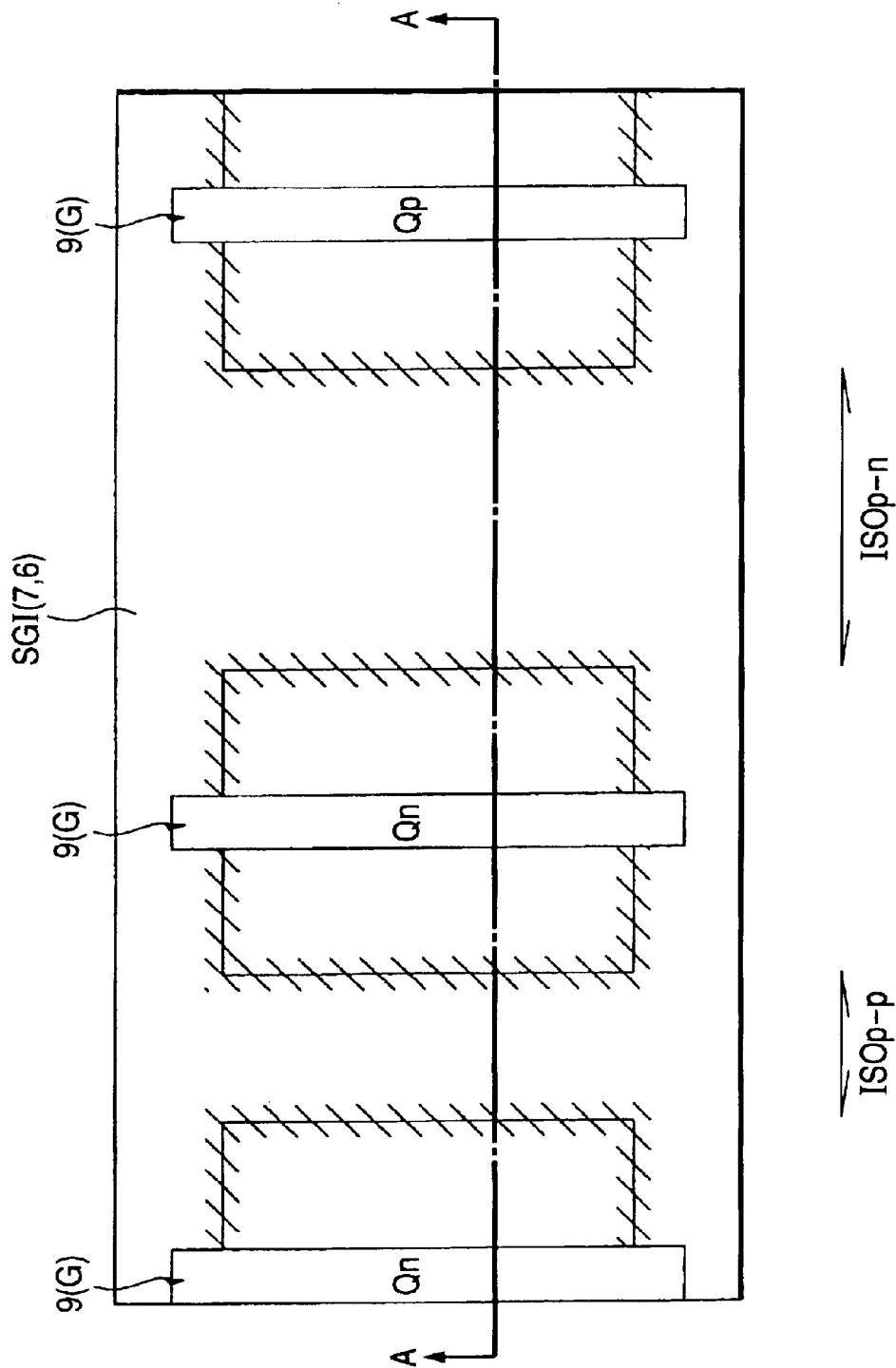
FIG. 18 is a fragmentary plan view of a substrate of the semiconductor integrated circuit device illustrating a further advantage of Embodiment 1 of the present invention.

Electrons trapped on the interface between the shallow groove isolation SGI and the SiGe layer 1b flow via a hatched portion shown in FIG. 18. FIG. 18 is a fragmentary plan view of the substrate of the semiconductor integrated circuit device illustrated in FIG. 17 and FIG. 17 corresponds to a cross-section taken along a line A—A of FIG. 18.

Figure 19:
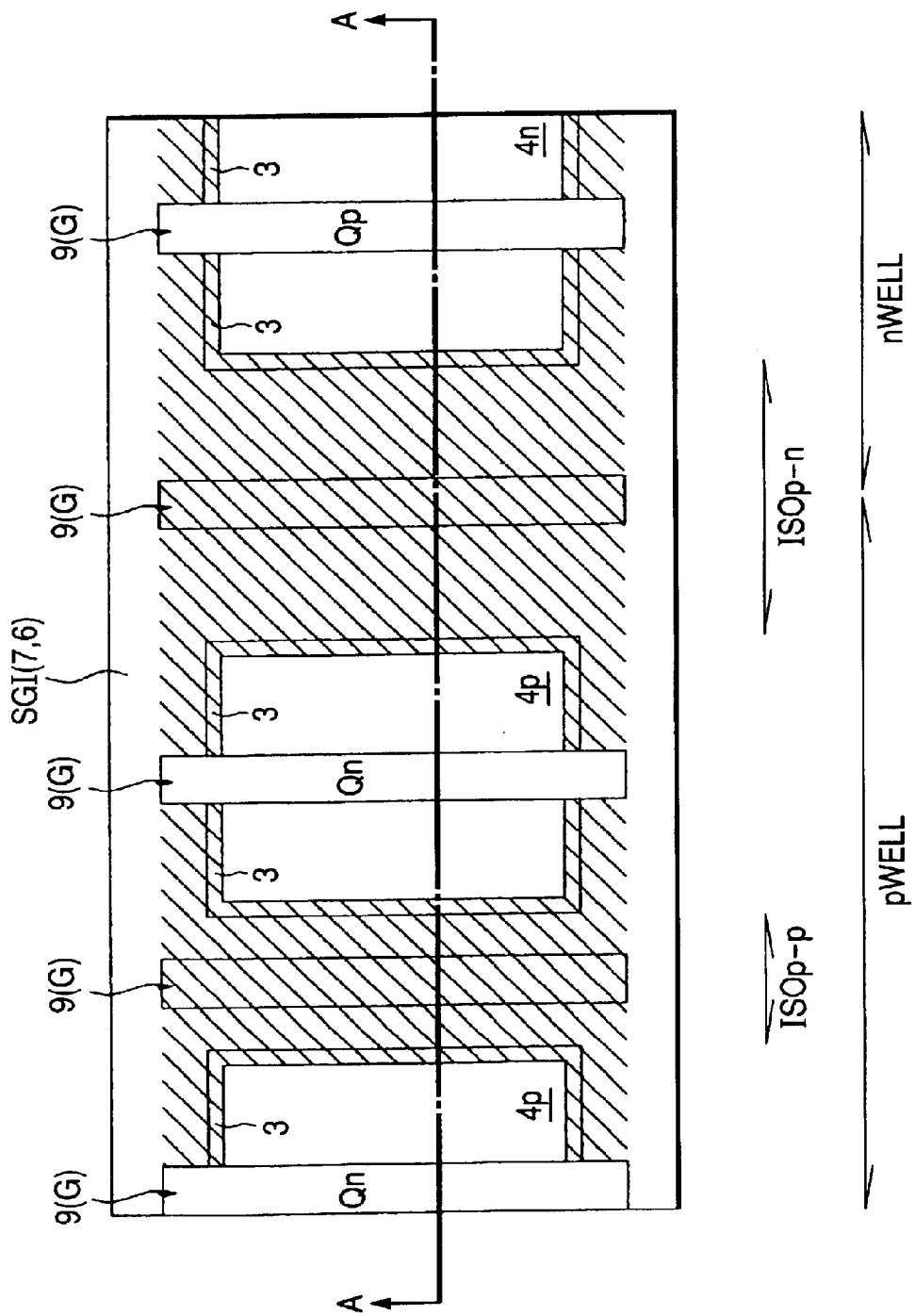
FIG. 19 is a fragmentary plan view of a substrate of the semiconductor integrated circuit device similar to that of FIG. 18.

When the bottom of the shallow groove isolation SGI exists in the SiGe layer 1b as in this Embodiment (refer to FIG. 1), a leakage current tends to occur via the bottom of the shallow groove isolation SGI, as shown by the hatched portion of FIG. 19, so that a countermeasure against the leak current becomes important.

The shallow groove isolation SGI tends to be shallow, reflecting the miniaturization of the element. This is partly because, when a pattern area becomes small, the aspect ratio (depth of a groove/pattern width) increases, resulting in a deterioration in the embedding property of an insulating film.

When the bottom of the shallow groove isolation SGI exists in the SiGe layer 1b, this Embodiment can be used suitably.

Figure 12:
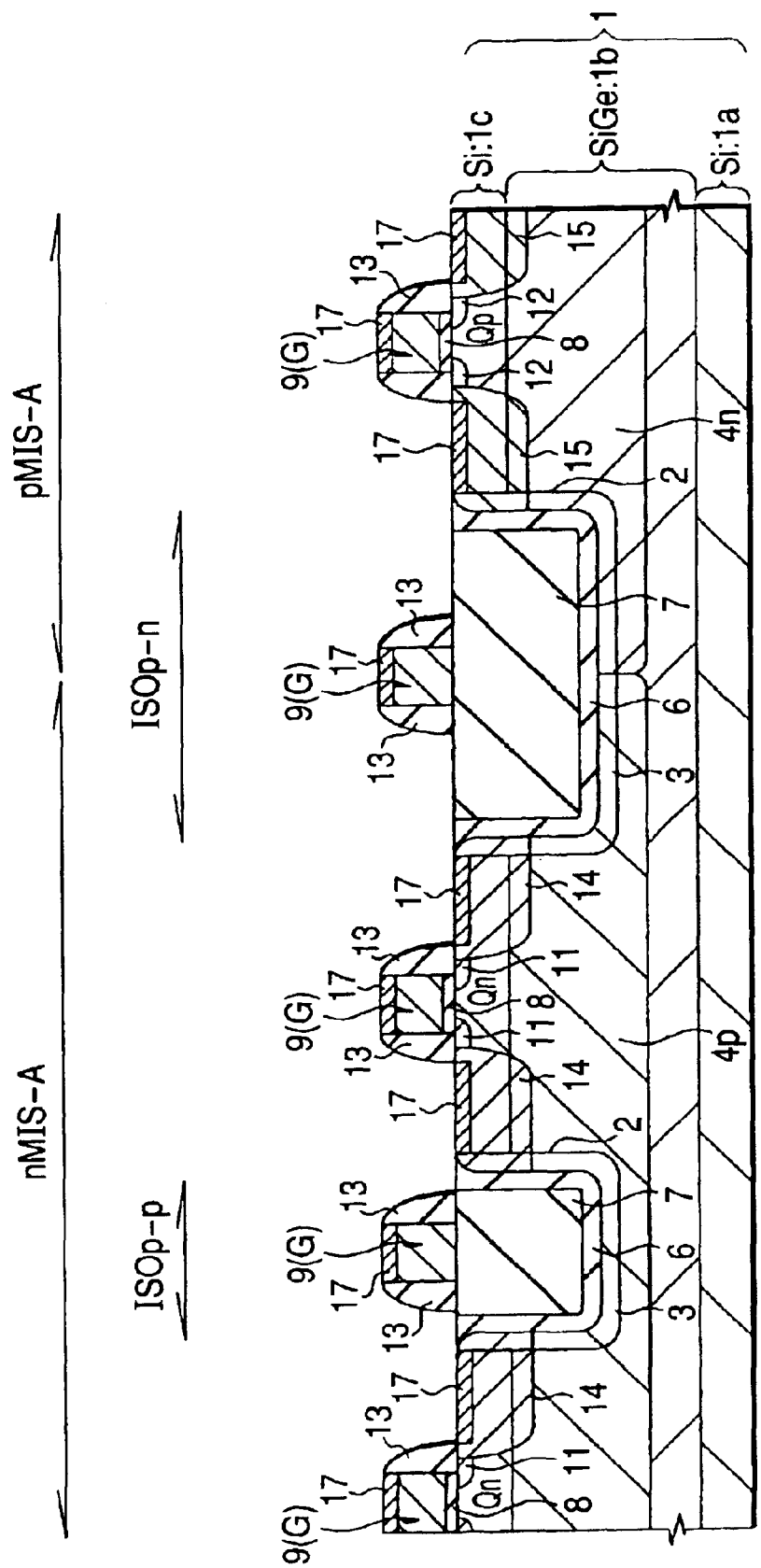
FIG. 12 is a fragmentary cross-sectional view of a substrate illustrating a step in the method of manufacture of the semiconductor integrated circuit device according to Embodiment 1 of the present invention.

As illustrated in FIG. 12, a metal film, such as a Co (cobalt) film, is deposited over the substrate 1, followed by heat treatment to cause a silicidation reaction at the contact portion of the metal film with each of the gate electrode G and substrate 1, whereby $CoSi_2$ (cobalt silicide film) 17 is formed in self alignment. Then, an unreacted portion of the Co film is removed, followed by heat treatment.

Figure 13:
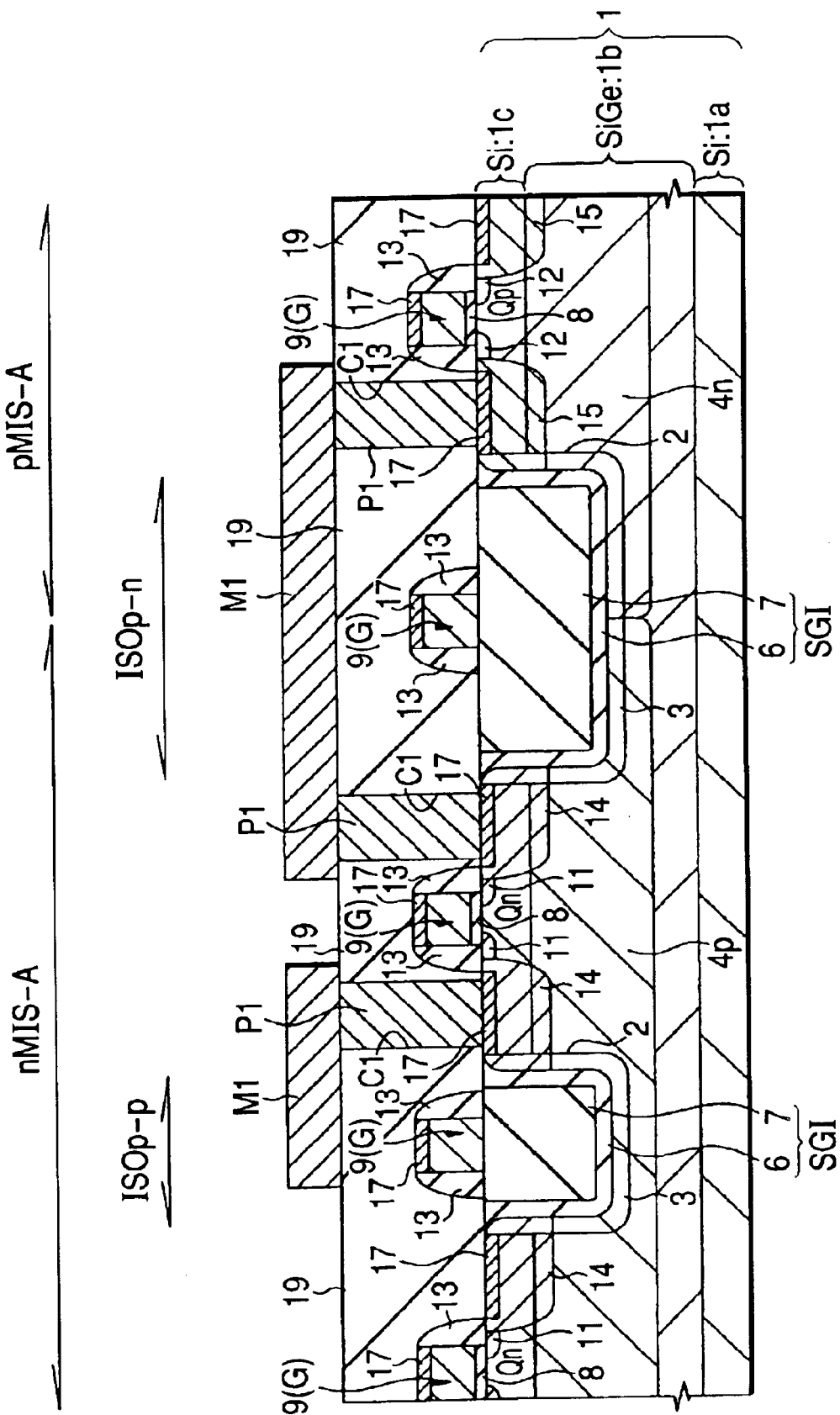
FIG. 13 is a fragmentary cross-sectional view of a substrate illustrating a step in the method of manufacture of the semiconductor integrated circuit device according to Embodiment 1 of the present invention.
Figure 14:
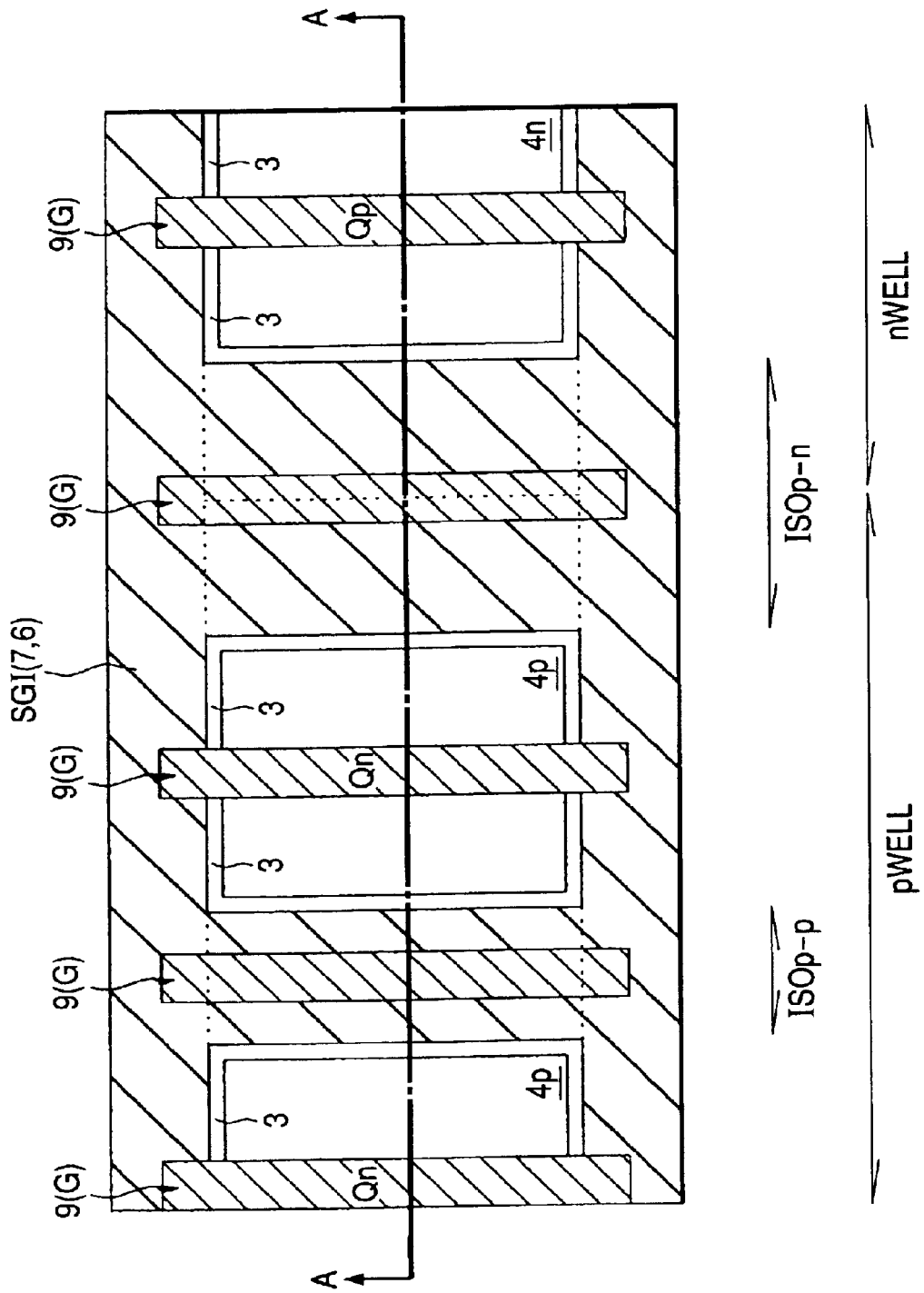
FIG. 14 is a fragmentary plan view of a substrate illustrating a step in the method of manufacture of the semiconductor integrated circuit device according to Embodiment 1 of the present invention.

As illustrated in FIG. 13, a silicon oxide film 19 is then deposited by CVD over the substrate 1 as an interlayer insulating film, and it is planarized at the surface thereof as needed. The silicon oxide film 19, deposited over the source and drain (15 and 14) and gate electrode of the MISFETS (Qn and Qp), are etched to form contact holes C1. The contact hole over the gate electrode is not illustrated.

Over the silicon oxide film 19, including the inside of the contact hole C1, W (tungsten film) is deposited, for example, as a conductive film. The W film outside the contact hole C1 is polished and removed by CMP, whereby a plug P1 is formed.

Over the silicon oxide film 19, including the plug P1, a W film, for example, serving as a conductive film, is deposited, followed by patterning into a desired shape to form a first-level interconnect M1.

By repeating these steps for the formation of the interlayer insulating film, plug and interconnect, a multilevel interconnect can be formed, but illustration and detailed description of the formation thereof are omitted.

Then, a protective film having an opening at the pad portion is formed over the uppermost-level interconnect and the substrate 1 in the form of a wafer is diced into a plurality of chips.

The pad portion and external lead are connected by a bump electrode or wire, and, if necessary, the chip is sealed at the periphery thereof with a resin, whereby a semiconductor integrated circuit device is completed.

Even after completion of the semiconductor integrated circuit device, it is preferred that the Si film 3 remains.
(Embodiment 2)

In Embodiment 1, a single crystal Si film formed by epitaxial growth is used as the Si film 3. Alternatively, a polycrystalline silicon film is usable.

The semiconductor integrated circuit device of this Embodiment will be described next in the sequence of its manufacturing steps.

FIGS. 20 to 23 are fragmentary cross-sectional views of a substrate, each illustrating the method of manufacture of the semiconductor integrated circuit device according to this Embodiment. Steps up to the formation of the groove 2 are similar to those described in connection with Embodiment 1, based on FIGS. 1 and 2, so that a further description thereof is omitted.

Figure 20:
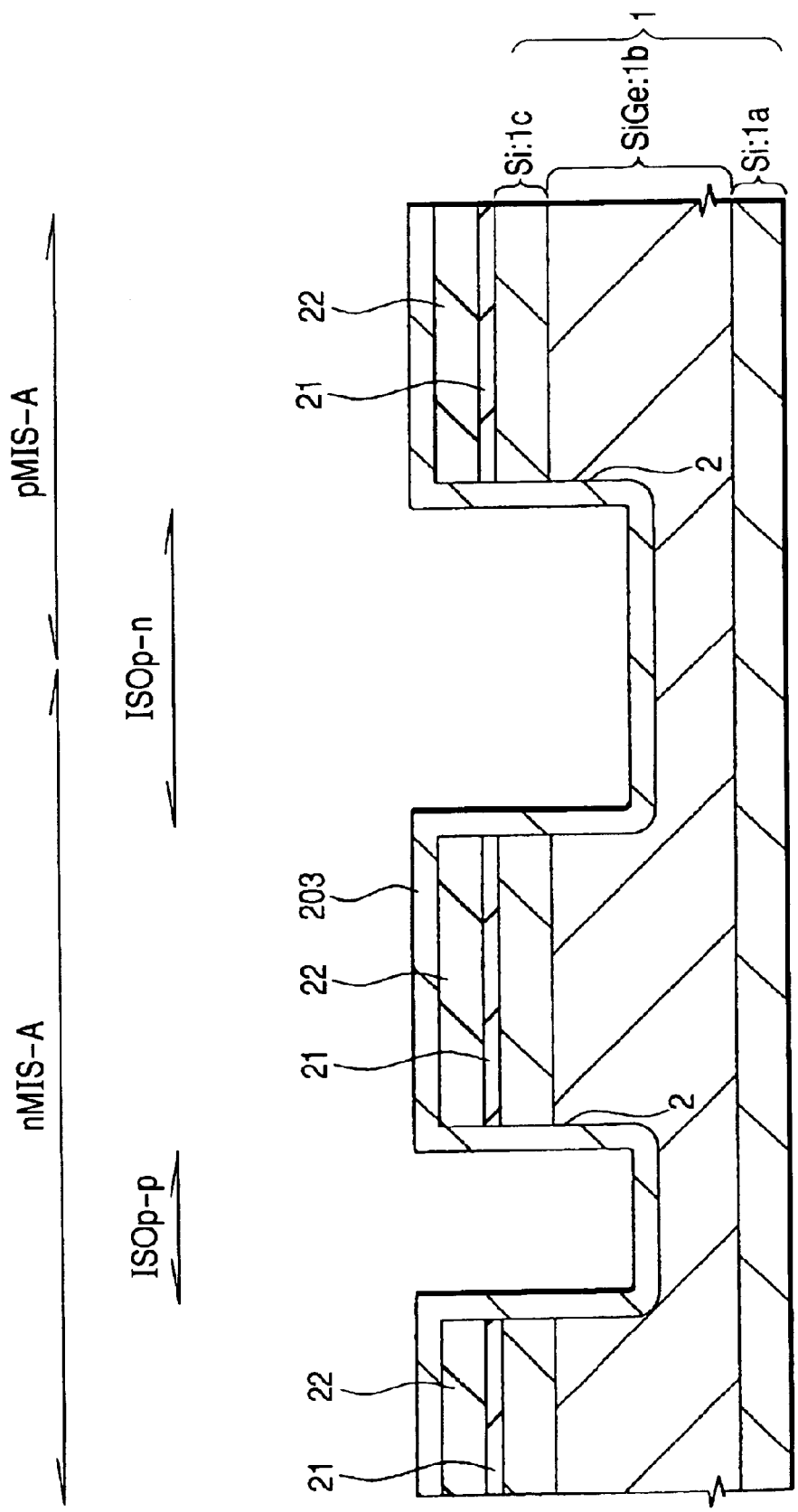
FIG. 20 is a fragmentary cross-sectional view of a substrate illustrating a step in the method of manufacture of a semiconductor integrated circuit device according to Embodiment 2 of the present invention.

As illustrated in FIG. 20, a polycrystalline silicon film 203 that is about 20 nm thick is deposited by CVD over the strained substrate 1 having the groove 2 formed therein. Numeral 21 indicates a silicon nitride film, while numeral 22 indicates a silicon nitride film.

Figure 21:
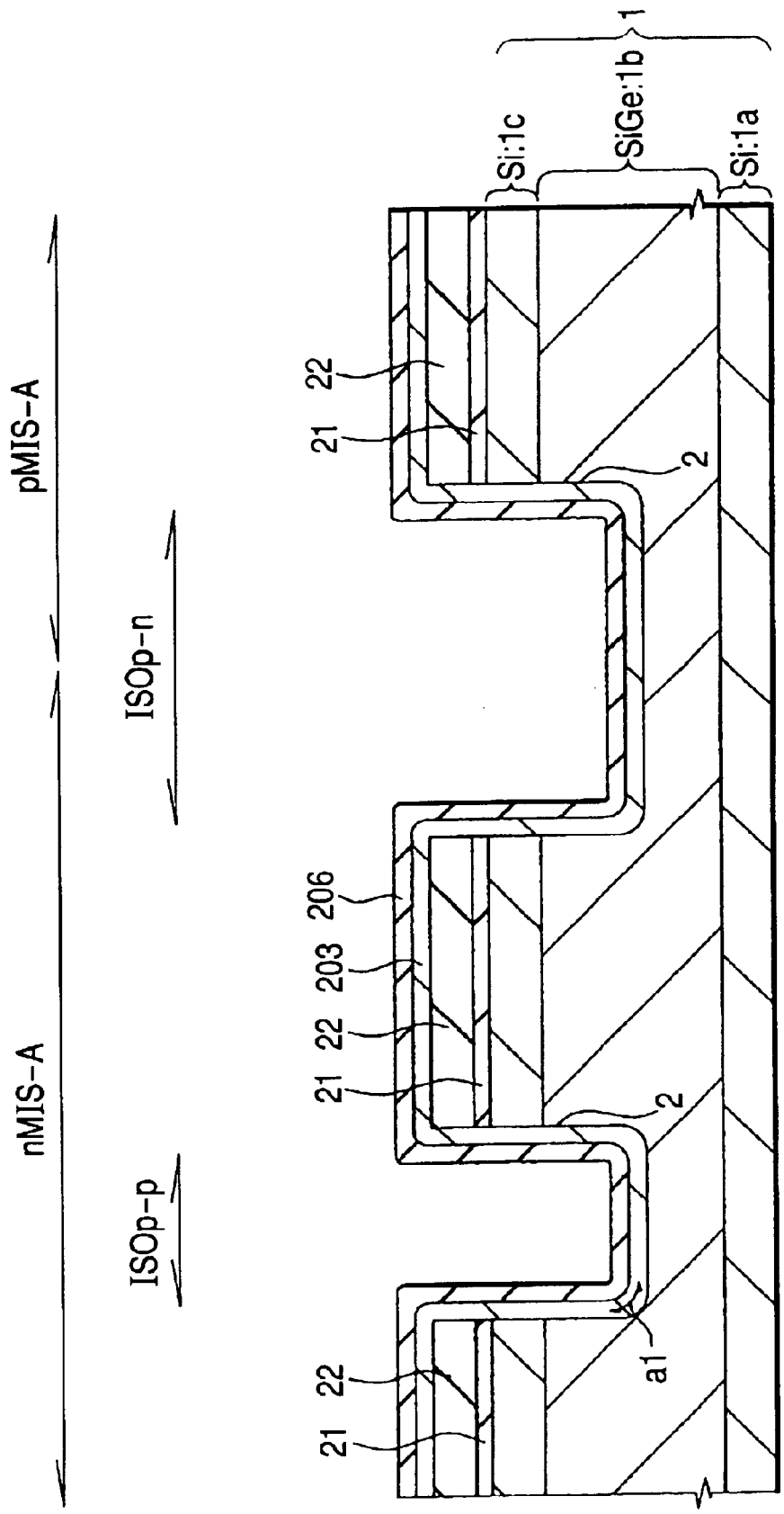
FIG. 21 is a fragmentary cross-sectional view of a substrate illustrating a step in the method of manufacture of the semiconductor integrated circuit device according to Embodiment 2 of the present invention.

As illustrated in FIG. 21, the surface of the polycrystalline silicon film 203 is oxidized to form an Si oxide film (thermal oxide film) 206. With this oxidation, a portion of the Si film 203 corresponding to a predetermined thickness from the surface thereof is oxidized. Thus, even after this oxidation, an unoxidized portion of the Si film 203 remains. For example, of the Si film 203 having a thickness of 20 nm, the upper 10 nm portion is oxidized to form an Si oxide film 206 that is about 20 nm thick, and the lower 10 nm portion of the Si film 203 is left unoxidized. This oxidation rounds the Si oxide film 206 existing at a corner portion (a1) on the bottom of the groove. As a result, generation of crystal defects owing to stress concentration at the corner portion can be suppressed.

Figure 22:
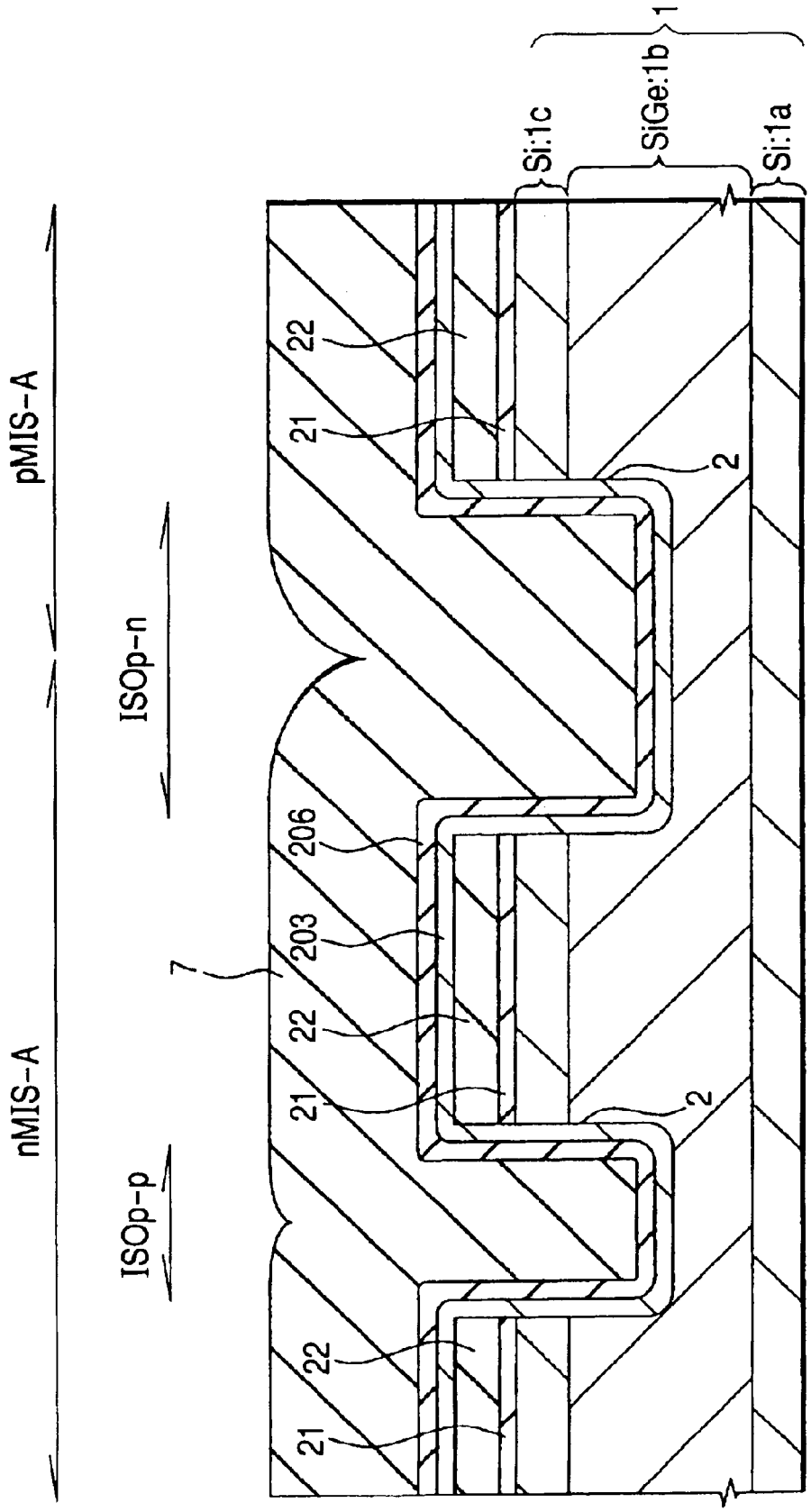
FIG. 22 is a fragmentary cross-sectional view of a substrate illustrating a step in the method of manufacture of the semiconductor integrated circuit device according to Embodiment 2 of the present invention.

As illustrated in FIG. 22, a silicon oxide film 7 is deposited as an insulating film by CVD over the substrate 1 (over the Si oxide film 206), including the inside of the groove 2. This silicon oxide film is, for example, an $O_3$-TEOS film, as described in Embodiment 1. The $O_3$-TEOS film is then heat treated in an oxygen atmosphere in order to remove impurities in the film and densify the film.

Figure 23:
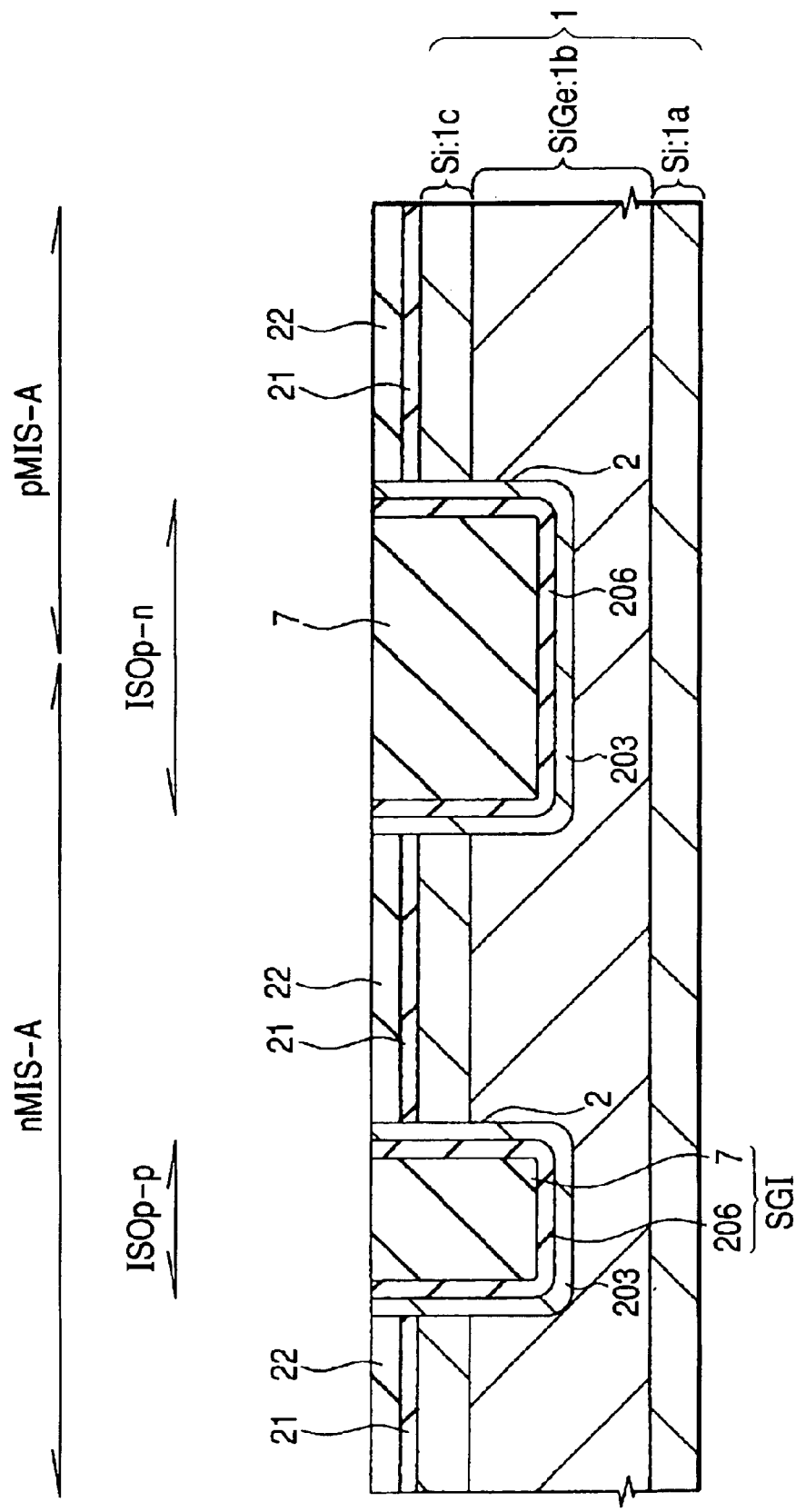
FIG. 23 is a fragmentary cross-sectional view of a substrate illustrating a step in the method of manufacture of the semiconductor integrated circuit device according to Embodiment 2 of the present invention.

As illustrated in FIG. 23, the silicon oxide film 7 is polished, for example, by CMP until the silicon nitride film 22 appears, whereby the surface of the silicon oxide film is planarized. Then, the silicon nitride film is removed.

As a result, the Si film 203 inside of the groove 2a and a shallow groove isolation SGI made of the Si oxide film 206 and the silicon oxide film 7 are completed. A region surrounded by this shallow groove isolation SGI will serve as an element formation region (refer to FIG. 14). The surface of the shallow groove isolation SIG will retreat gradually. The intra-well isolation (ISOp-p) has a width H1 of, for example, about 0.2 µm. The width H2 of the well-well isolation (ISOn-p) is greater than the width H1 and is, for example, about 0.4 µm.

In the element formation region, MISFETs (Qn and Qp) are then formed. Subsequent formation steps are similar to those described in connection with Embodiment 1, based on FIGS. 9 to 14, so a further explanation thereof is omitted.

This Embodiment also brings about similar effects to those of Embodiment 1. The interface state density between the shallow groove isolation SGI and substrate 1 is considered to be smaller via the single crystal Si film of Embodiment 1, than it is via the polycrystalline silicon film.
(Embodiment 3)

In Embodiments 1 and 2, the CVD insulating film (7) was deposited directly over the Si oxide film (6 or 206), but it is possible to dispose therebetween a silicon nitride film.

Figure 24:
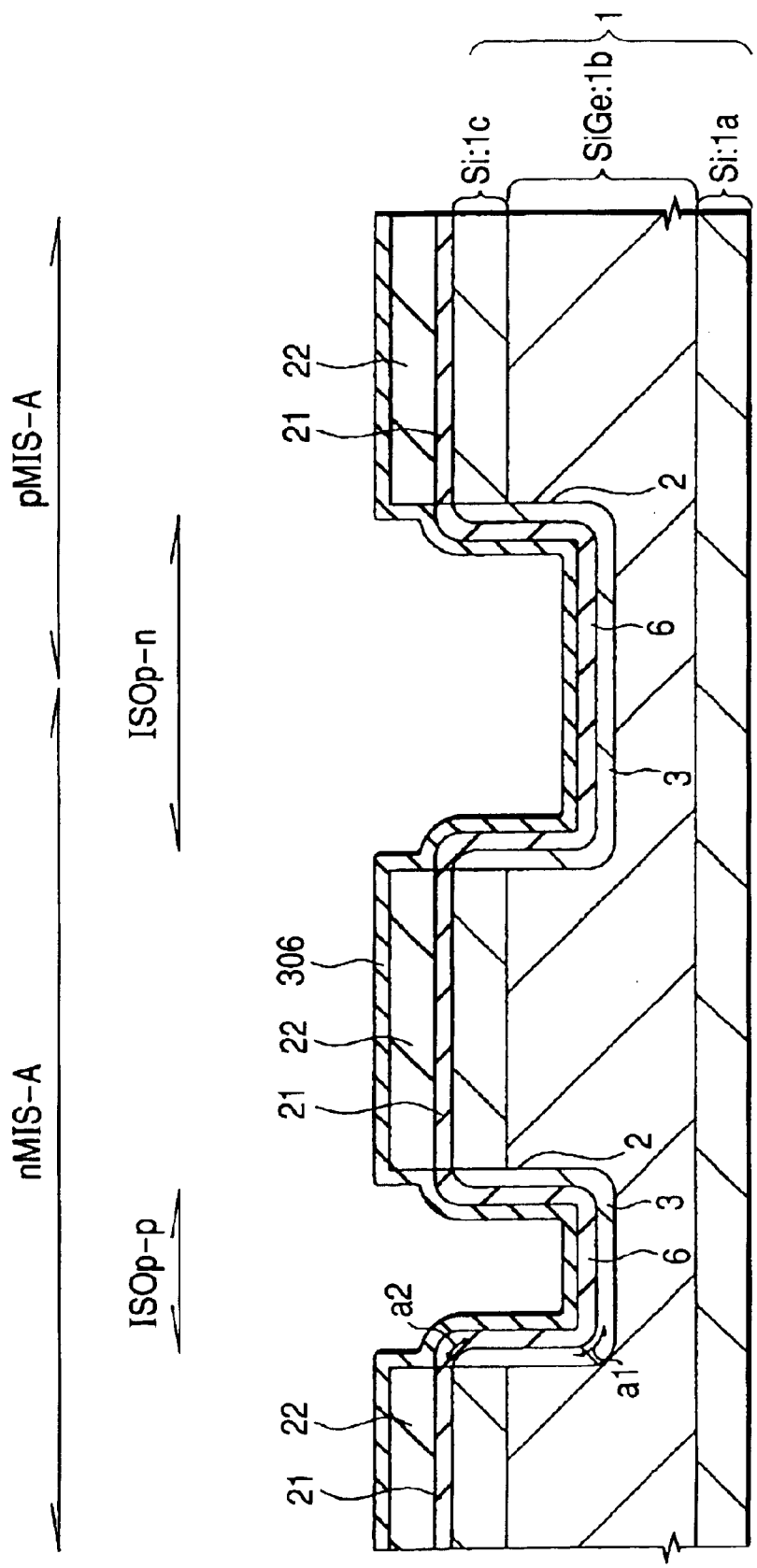
FIG. 24 is a fragmentary cross-sectional view of a substrate illustrating method of manufacture of a semiconductor integrated circuit device according to Embodiment 3 of the present invention.

The semiconductor integrated circuit device of this Embodiment will be described next in the sequence of its manufacturing steps. FIGS. 24 to 28 are each a fragmentary cross-sectional view of a substrate illustrating the method of manufacture of the semiconductor integrated circuit device of this Embodiment. Steps up to the formation of the Si oxide film 6 are similar to those of Embodiment 1, as described with reference to FIGS. 1 to 5, so that an explanation of them will be omitted. As described in detail in connection with Embodiment 1 (FIG. 5), the Si oxide film 6 existing at the corner portion (a1) on the bottom of the groove or that existing at the corner portion (a2) at the upper portion of the side walls of the groove are rounded, however this is illustrated in FIG. 24 only simply.

(1) Over the strained substrate 1 having the Si oxide film 6 formed thereover, a silicon nitride film 306 that is about 10 nm thick is deposited using CVD, as illustrated in FIG. 24. Numeral 21 indicates a silicon oxide film and numeral 22 indicates a silicon nitride film.

Figure 25:
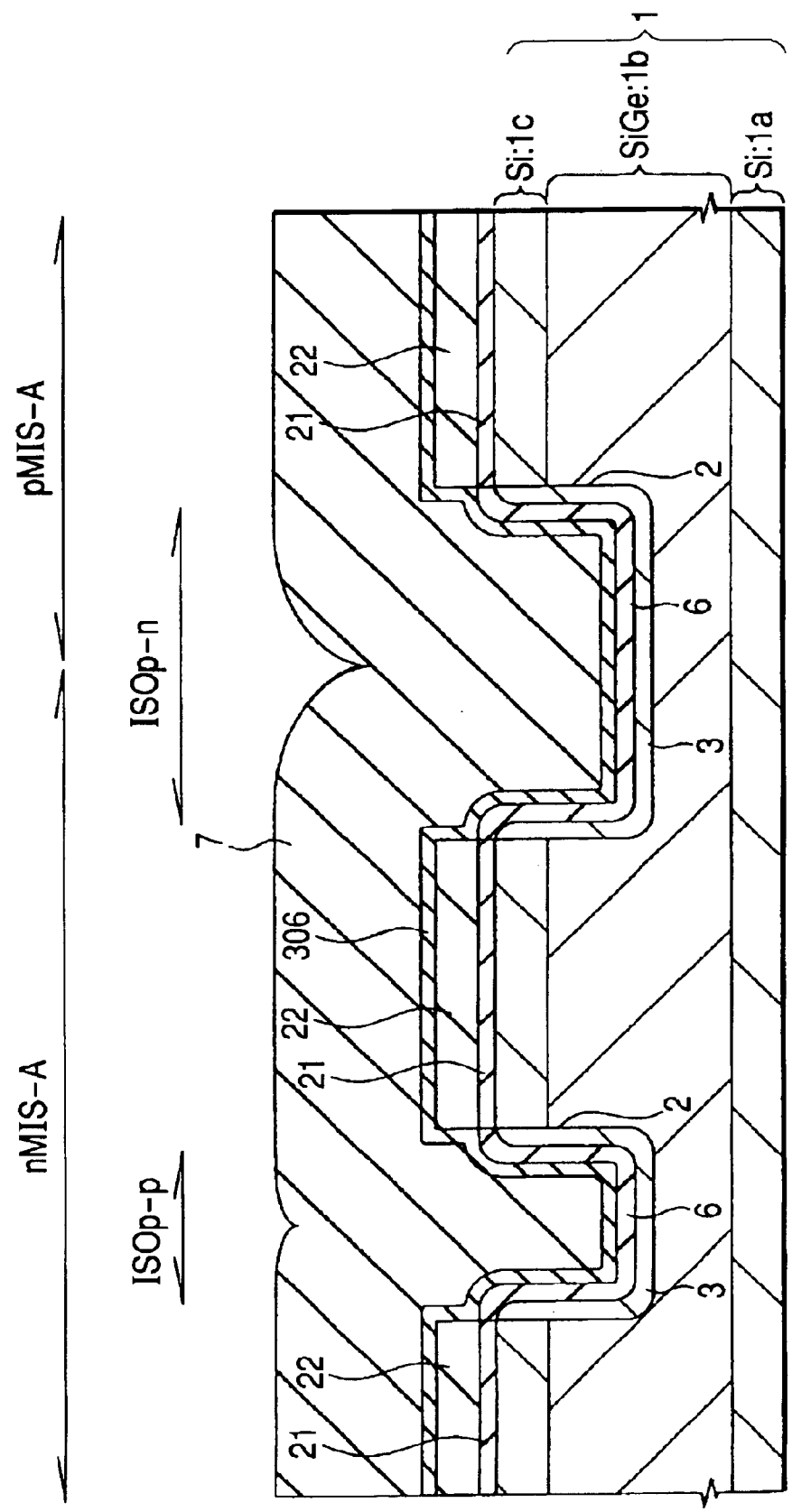
FIG. 25 is a fragmentary cross-sectional view of a substrate illustrating a step in the method of manufacture of the semiconductor integrated circuit device according to Embodiment 3 of the present invention.

As illustrated in FIG. 25, over the substrate 1 (over the silicon nitride film 306) including the inside of the groove 2, a silicon oxide film 7 is deposited as an insulating film by CVD. This silicon oxide film is, for example, an $O_3$-TEOS film, as explained in connection with Embodiment 1. Then, the $O_3$-TEOS film is heat treated in an oxygen atmosphere to remove impurities therefrom and to densify the film.

Figure 26:
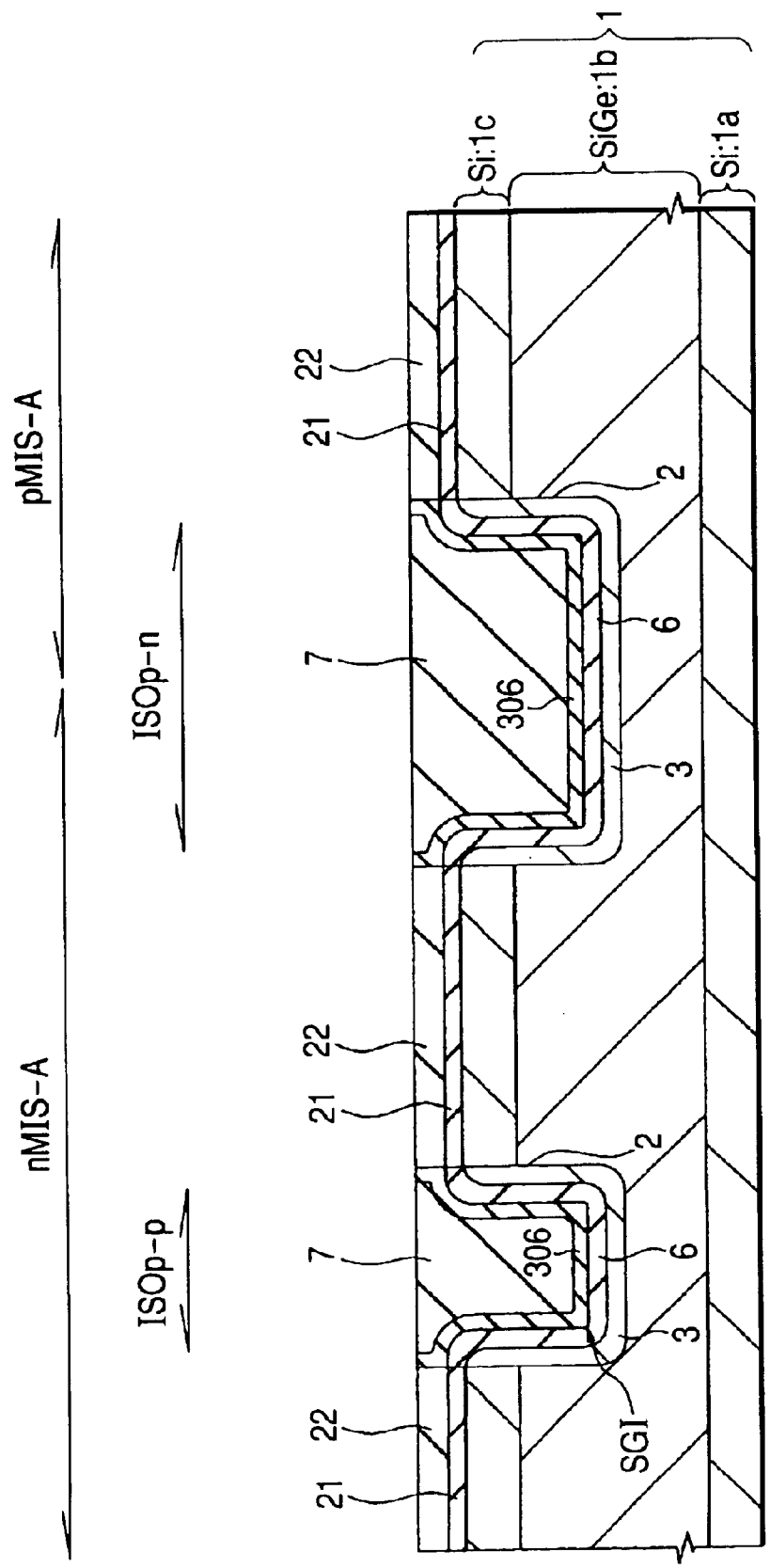
FIG. 26 is a fragmentary cross-sectional view of a substrate illustrating a step in the method of manufacture of the semiconductor integrated circuit device according to Embodiment 3 of the present invention.

As illustrated in FIG. 26, the silicon oxide film 7 is polished, for example, by CMP until the silicon nitride film 22 is exposed and the surface of the silicon oxide film is planarized. Then, the silicon nitride film 22 is removed.

As a result, the Si film 3 inside wall of the groove 2, and a shallow groove isolation SGI made of the Si oxide film 6, silicon nitride film 306 and silicon oxide film 7 are completed. A region surrounded by this shallow groove isolation SGI is to be an element formation region (refer to FIG. 14). The surface of the shallow groove isolation SIG will retreat gradually. The intra-well isolation (ISOp-p) has a width H1 of, for example, about 0.2 $\mu$m. The width H2 of the well-well isolation (ISOn-p) is greater than the width H1 and is, for example, about 0.4 $\mu$m.

In the element formation region, MISFETs (Qn, Qp) are then formed. Subsequent formation steps are similar to those as described in connection with Embodiment 1, based on FIGS. 9 to 14, so a detailed explanation thereof is omitted.

This embodiment brings about effects similar to those of Embodiment 1. In addition, since the silicon nitride film 306 is formed over the Si oxide film 6, the progress of oxidation of the Si oxide film 6, which will otherwise occur owing to heat treatment after the formation of the Si oxide film 6, for example, densification of the $O_3$-TEOS film (7), as explained in detail in connection with Embodiment 1, or activation of impurities constituting the source and drain (14 and 15), can be suppressed. This makes it possible to suppress oxidation of the Si film 3, thereby leaving the Si film 3 without failure. When the oxidation of the Si oxide film 6 proceeds, volumetric expansion occurs, whereby stress is applied to the shallow groove isolation and crystal defects tend to occur. Formation of the silicon nitride film 306 reduces the influence of the stress, thereby preventing the generation of crystal defects.

Figure 27:
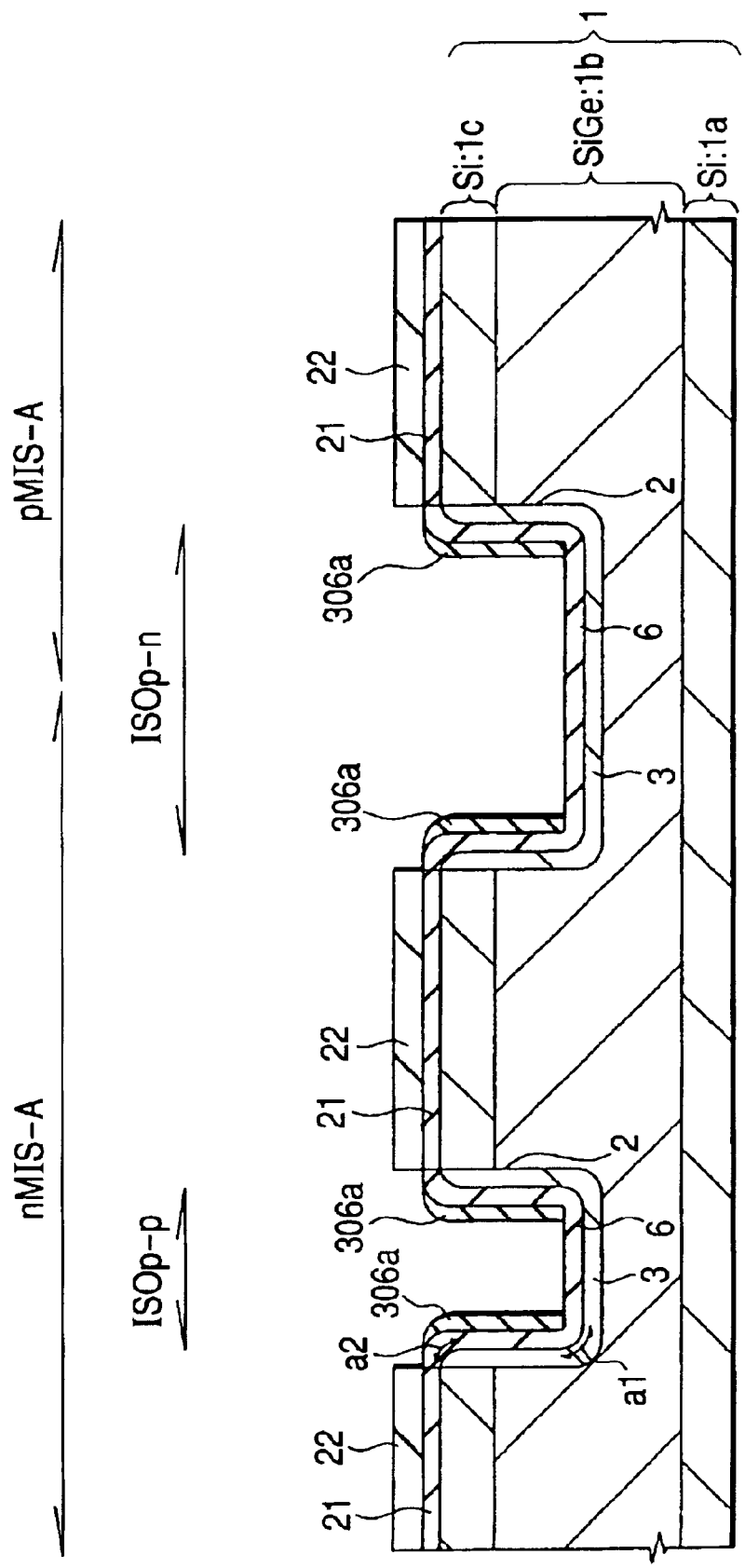
FIG. 27 is a fragmentary cross-sectional view of a substrate illustrating a step in the method of manufacture of the semiconductor integrated circuit device according to Embodiment 3 of the present invention.

(2) After deposition of the silicon nitride film 306 that is about 10 nm thick by CVD over the strained substrate 1 having the Si oxide film 6 formed thereon, the silicon nitride film may be anisotropically etched, as illustrated in FIG. 27, to leave the silicon nitride film 306a only on the side wall portions of the groove 2. The Si oxide film 6 existing at the corner portions (a1 and a2) of the groove is rounded, but such portions are illustrated only simply in FIG. 27.

Figure 28:
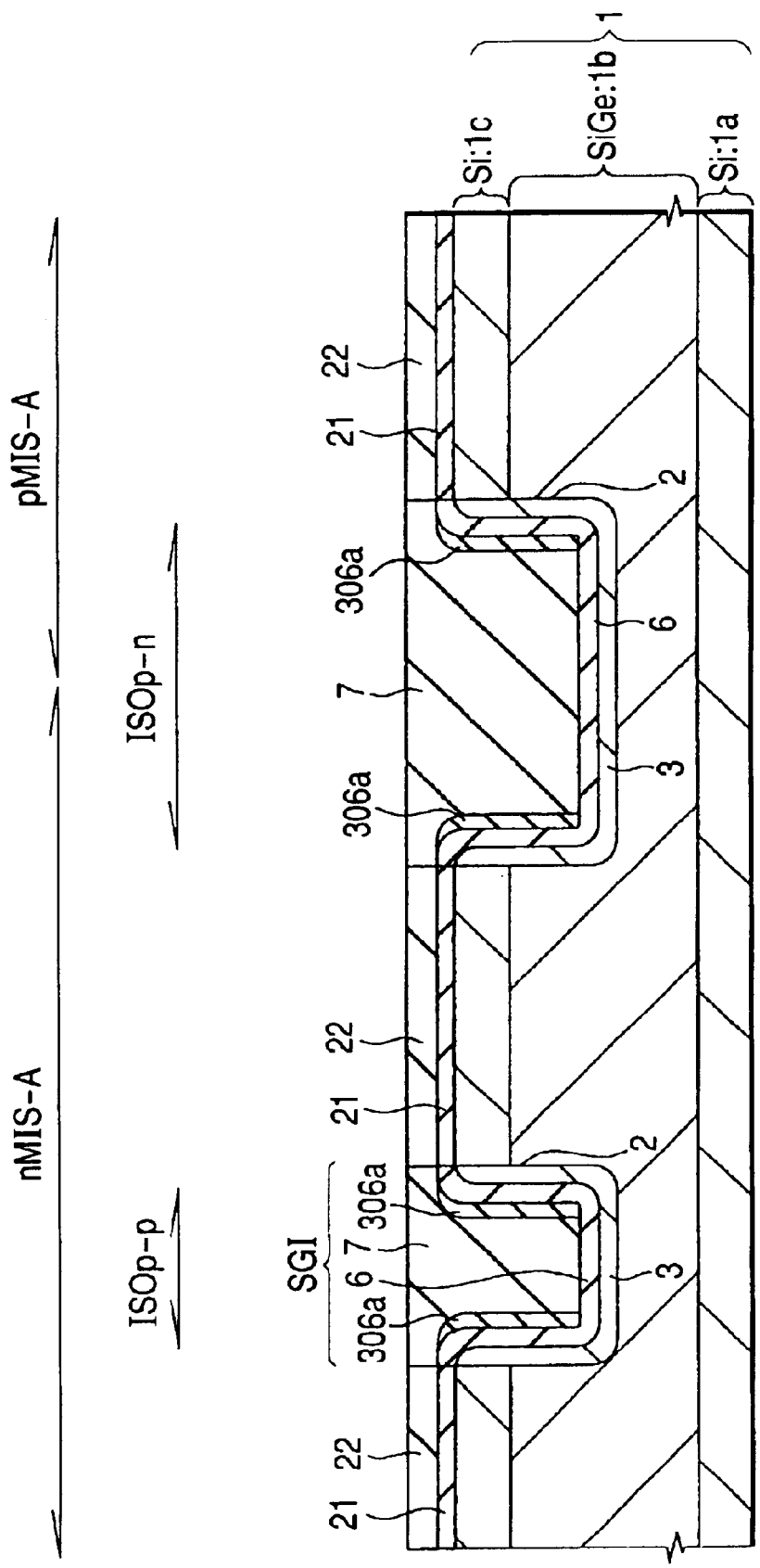
FIG. 28 is a fragmentary cross-sectional view of a substrate illustrating a step in the method of manufacture of the semiconductor integrated circuit device according to Embodiment 3 of the present invention.

Then, as in the case (1), after deposition of a silicon oxide film 7 by CVD to serve as an insulating film over the substrate 1, including the inside of the groove 2, the silicon oxide film 7 is polished until the silicon nitride film 22 is exposed, whereby the surface of the silicon oxide film is planarized (FIG. 28). Then, the silicon nitride film 22 is removed.

Even by leaving the silicon nitride film 306a only on the side wall portions of the groove, progress of the oxidation of the Si oxide film 6 can be suppressed. In other words, since the bottom of the groove is covered by the thick silicon oxide film 7, the progress of the oxidation of the Si oxide film 6 is considered to be slow. Accordingly, by leaving the silicon nitride film 306a only on the side wall portions of the groove, which are easily influenced by oxidation, the oxidation of the Si film 3 can be suppressed. In addition, crystal defects can be reduced.

In this Embodiment, formation of the nitride film over the Si oxide film 6 was described in reference to Embodiment 1, but the nitride film can be formed over the Si oxide film 206 of Embodiment 2 using similar steps.

(Embodiment 4)

A semiconductor integrated circuit device of this Embodiment will be described in the sequence of its manufacturing steps. FIGS. 29 to 33 are fragmentary cross-sectional views of the substrate illustrating the method of manufacture of the semiconductor integrated circuit device of this Embodiment. Steps up to the formation of the groove 2 are similar to those of Embodiment 1, as described with reference to FIGS. 1 and 2, so that a description thereof is omitted.

Figure 29:
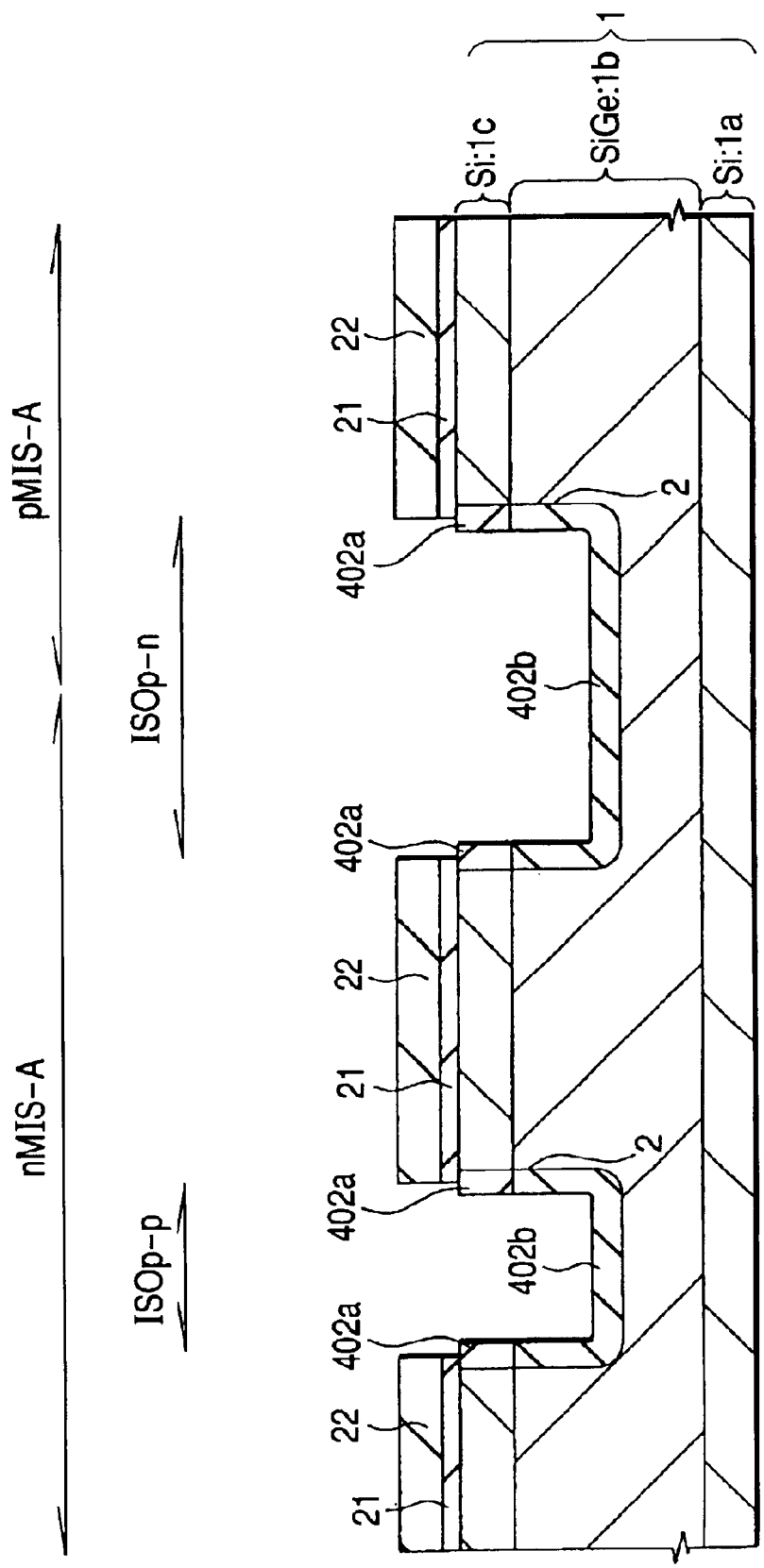
FIG. 29 is a fragmentary cross-sectional view of a substrate illustrating a step in the method of manufacture of a semiconductor integrated circuit device according to Embodiment 4 of the present invention.

First, the surface of the strained substrate 1, having the groove 2 formed therein, is oxidized to form an Si oxide film 402a and an SiGe oxide film 402b, as illustrated in FIG. 29. These oxide films each has a thickness of about 20 nm.

Figure 30:
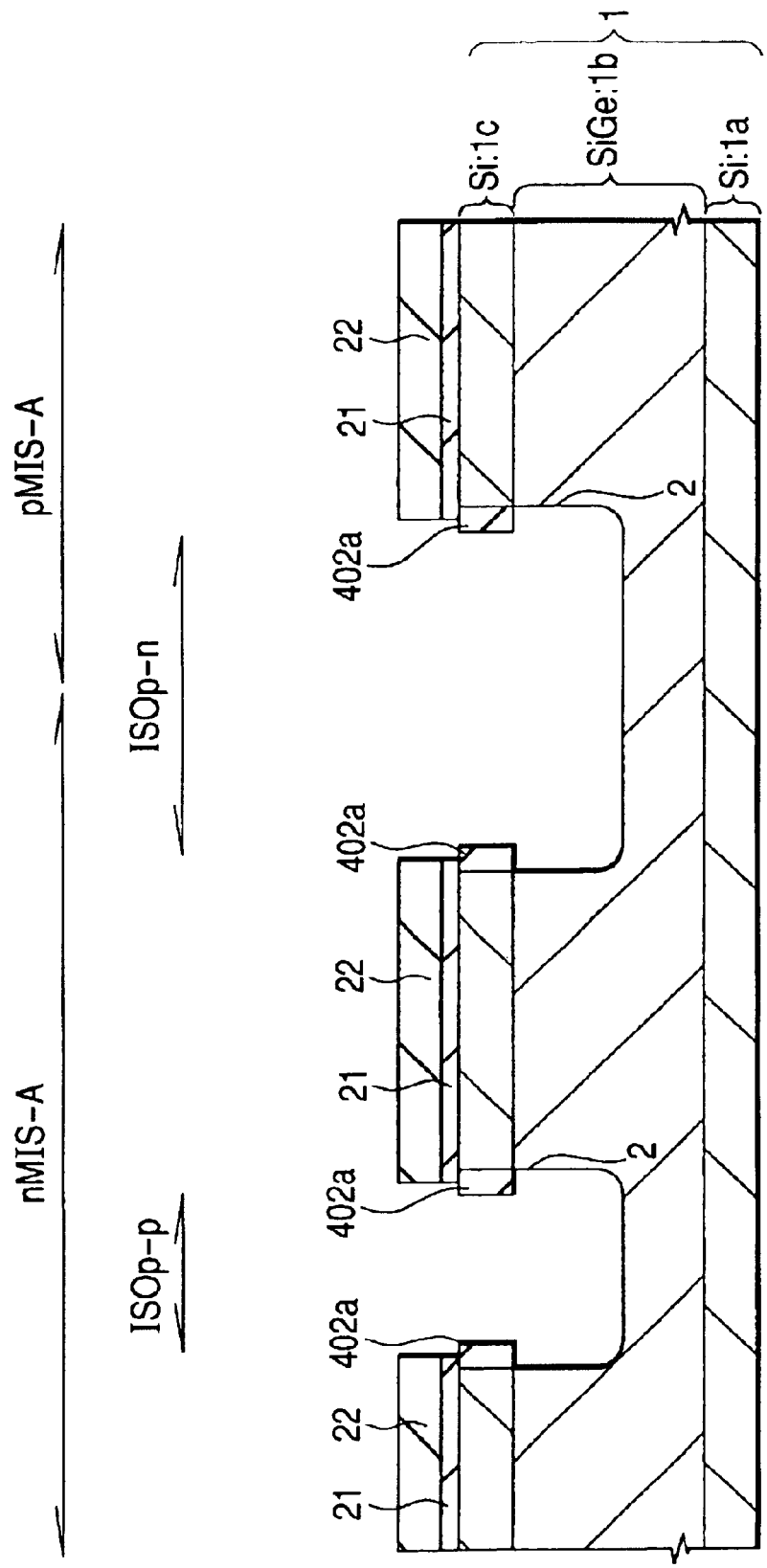
FIG. 30 is a fragmentary cross-sectional view of a substrate illustrating a step in the method of manufacture of the semiconductor integrated circuit device according to Embodiment 4 of the present invention.

As illustrated in FIG. 30, only the SiGe oxide film 402b is selectively removed using, for example, $H_2O$ (water), while the Si oxide film 402b is left. This means that the SiGe oxide film 402b is etched under the conditions of a high selectivity relative to the Si oxide film. The SiGe oxide film is water soluble, so that it can be removed easily.

As a result, with regard to the inside wall of the groove 2, only the SiGe layer 1b is exposed therefrom and the Si layer 1c is covered with the Si oxide film 402a.

Figure 31:
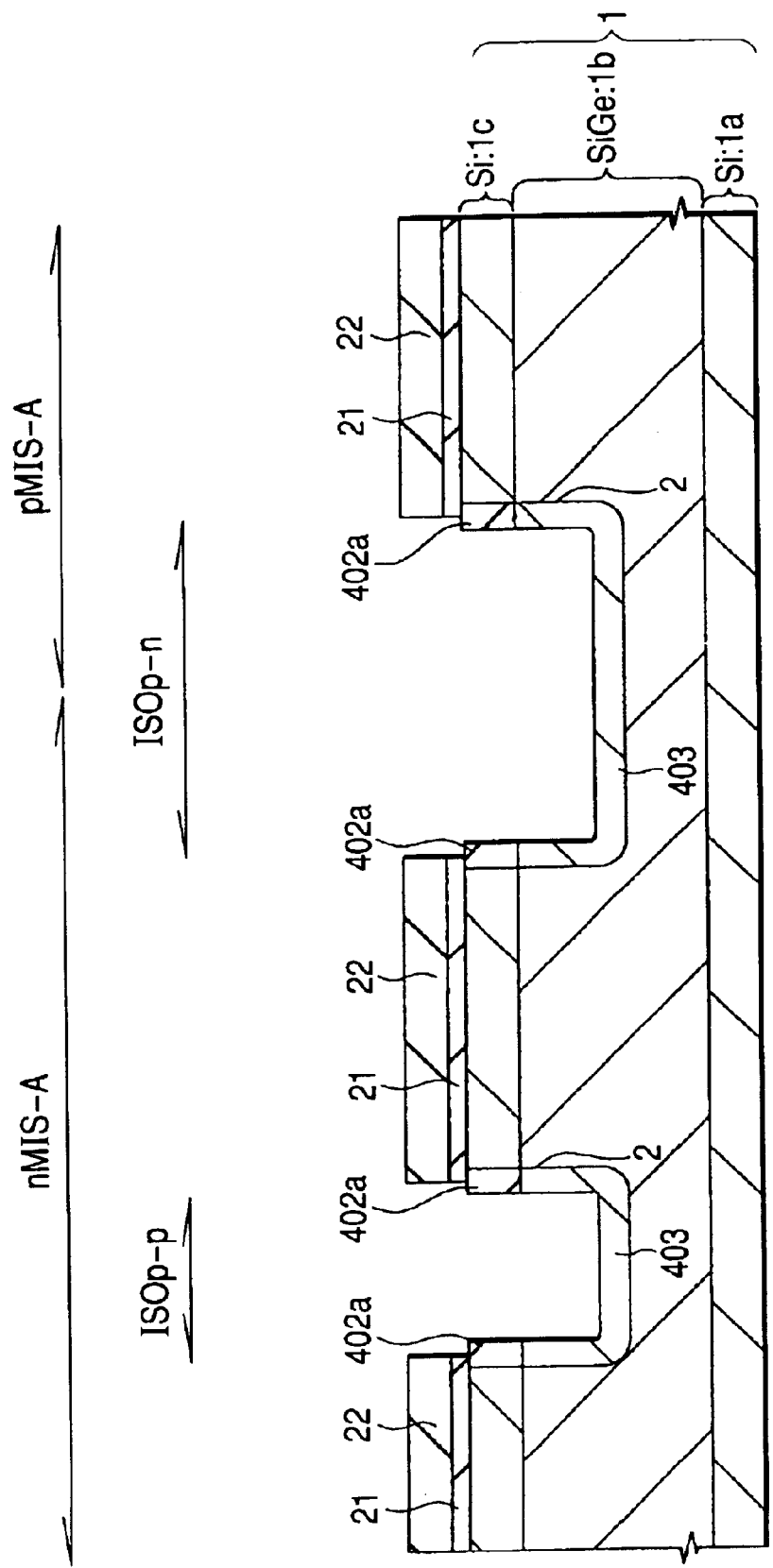
FIG. 31 is a fragmentary cross-sectional view of a substrate illustrating a step in the method of manufacture of the semiconductor integrated circuit device according to Embodiment 4 of the present invention.

A natural oxide film over the surface of the SiGe layer 1b, that is exposed from the groove, is then removed by reduction, for example, heat treatment in a hydrogen atmosphere. As illustrated in FIG. 31, single crystal Si is epitaxially grown over the exposed SiGe layer 1b to form an Si film 403 that is about 20 nm thick. Growth of Si does not occur over the Si layer 1c on the side walls of the groove, because the Si oxide film 402a remains on the Si layer.

Figure 32:
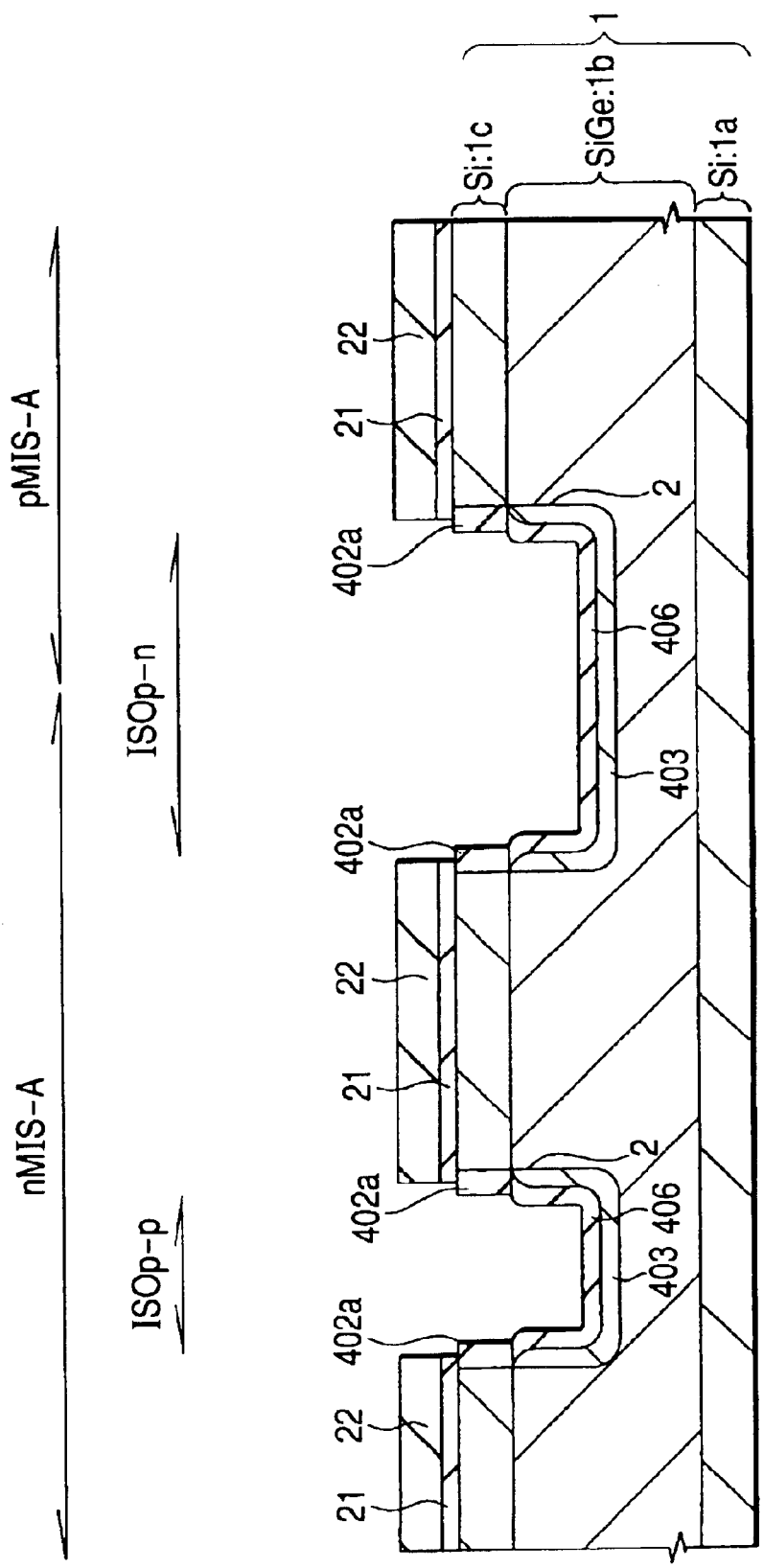
FIG. 32 is a fragmentary cross-sectional view of a substrate illustrating a step in the method of manufacture of the semiconductor integrated circuit device according to Embodiment 4 of the present invention.

As illustrated in FIG. 32, the surface of the Si film 403 over the inside wall of the groove 2 is oxidized to form an Si oxide film (thermal oxide film) 406.

Figure 33:
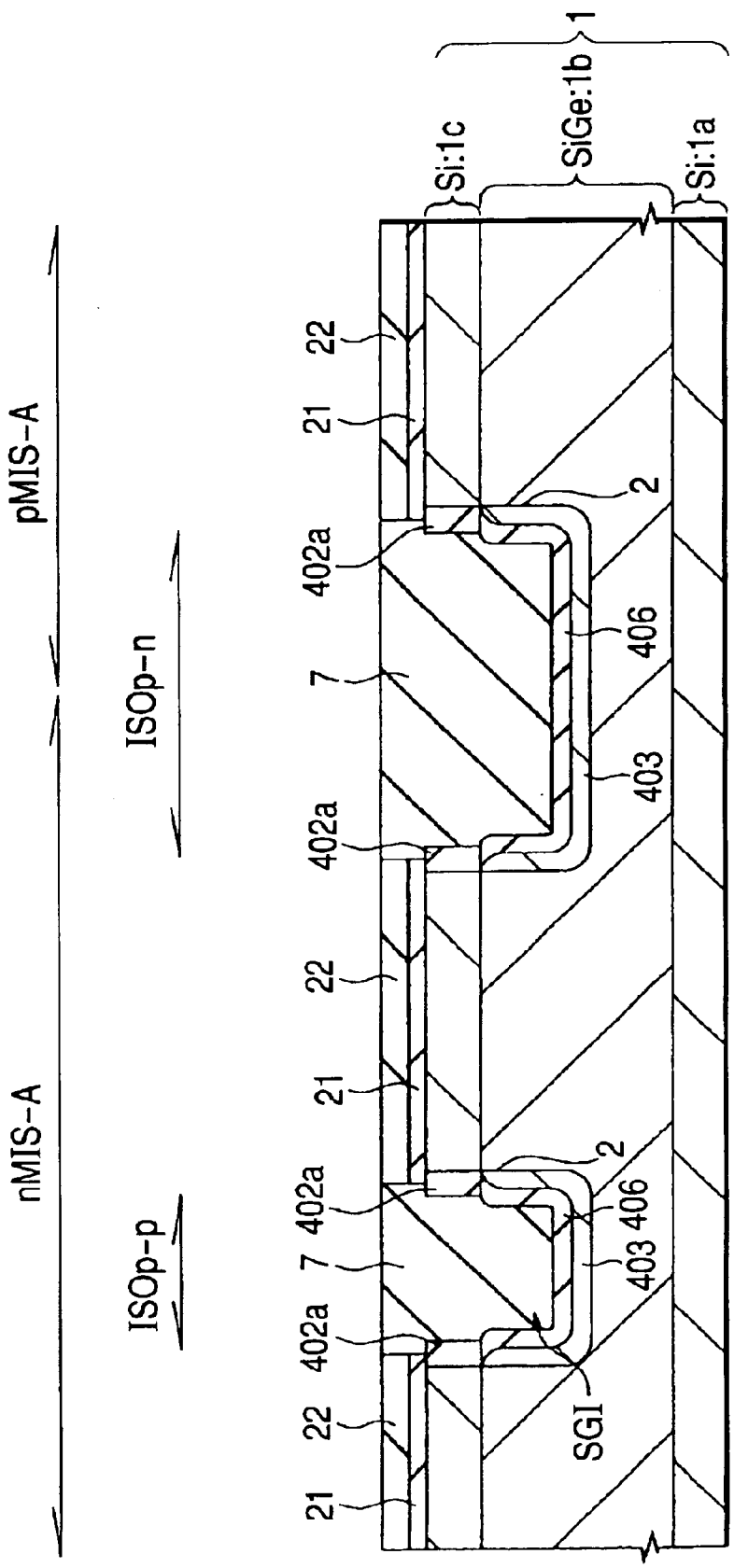
FIG. 33 is a fragmentary cross-sectional view of a substrate illustrating a step in the method of manufacture the semiconductor integrated circuit device according to Embodiment 4 of the present invention.

As illustrated in FIG. 33, a silicon oxide film 7 is deposited by CVD as an insulating film over the substrate 1, including the inside of the groove 2 (over the Si oxide films 402a and 406). This silicon oxide film is, for example, an $O_3$-TEOS film, as described in Embodiment 1. The $O_3$-TEOS film is then heat treated in an oxygen atmosphere in order to remove impurities in the film and densify the film.

The silicon oxide film 7 is then polished, for example, by CMP until the silicon nitride film 22 appears, whereby the surface of the silicon oxide film is planarized. Then, the silicon nitride film 22 is removed.

As a result, the Si film 403 inside of the groove 2, and a shallow groove isolation SGI made of the Si oxide films 402a and 406 and silicon oxide film 7 are completed. A region surrounded by this shallow groove isolation SGI will serve as an element formation region (refer to FIG. 14). The surface of the shallow groove isolation SIG will retreat gradually. The intra-well isolation (ISOp-p) has a width H1 of, for example, about 0.2 $\mu$m. The width H2 of the well-well isolation (ISOn-p) is greater than the width H1 and is, for example, about 0.4 $\mu$m.

In the element formation region, MISFETs (Qn, Qp) are then formed. Subsequent formation steps are similar to those as described in connection with Embodiment 1, based on FIGS. 9 to 14, so a detailed explanation thereof is omitted.

This Embodiment also brings about effects similar to those of Embodiment 1. In addition, in this Embodiment, Si is epitaxially grown only over the SiGe layer 1b inside of the groove, using the Si oxide film 402a as a mask, so that in the Si film 403, no boundary exists between a portion grown from the Si layer 1c and a portion grown from the SiGe layer 1b (refer to FIG. 3). This brings about an improvement in the film quality.

If such a boundary exists in the Si layer, a surface discontinuity appears in the crystal lattice, which presumably causes crystal defects.

This Embodiment, however, can avoid formation of a surface discontinuity in the Si film 403, thereby reducing the crystal defects of the remaining Si film 403.

The features of Embodiment 3 may be applied to this Embodiment; in other words, a silicon nitride film may be formed over the Si oxide film 406 of this Embodiment.

The present invention has been described specifically based on some embodiments. However, it should be borne in mind that the present invention is not limited to the above-described embodiments, but can be modified to an extent not departing from the gist of the invention.

In the above-described embodiments, the invention was applied to the case where a MISFET is formed, but the invention is applicable also to semiconductor integrated circuit devices having other semiconductor device configurations, for example, a bipolar transistor, and a current channel and element isolation on the surface of the substrate.

Advantages of the invention disclosed in the present application will be described briefly.

A shallow groove isolation is formed of a groove, which is formed in an isolation region of a strained substrate having an SiGe layer and a first Si layer formed thereover by epitaxial growth, and an insulating film inside of the groove. Since a second Si layer is formed between the shallow groove isolation, which penetrates the first Si layer and has its bottom in the SiGe layer and the SiGe layer, the element isolating properties of the strained substrate can be improved. In addition, the characteristics of a semiconductor integrated circuit formed over the main surface of the strained substrate can be improved. Moreover, the yield of the device can be improved.

In particular, even in the case where a well has a high concentration or a conductive film is disposed over the shallow groove isolation, the leakage current via the shallow groove isolation can be reduced, leading to an improvement in element isolating properties.

What is claimed is:

1. A semiconductor integrated circuit device, comprising:
   (a) a semiconductor substrate having an SiGe layer and a first Si layer epitaxially grown thereover, and having element formation regions each partitioned by element isolation regions;
   (b) a shallow groove isolation which has a groove formed in each of the element isolation regions and an insulating film inside of the groove, said groove penetrating through the first Si layer and having a bottom in the SiGe layer;
   (c) a second Si layer formed between the shallow groove isolation and the SiGe layer; and
   (d) a semiconductor element formed over the main surface of the semiconductor substrate in the element formation regions.

2. A semiconductor integrated circuit device according to claim 1,
   wherein the element formation regions are each a region exposed from the semiconductor substrate in a semiconductor region of a first conductivity type or in a semiconductor region of a second conductivity type which is an opposite conductivity type to the first conductivity type, and
   wherein the semiconductor region has a bottom in the SiGe layer.

3. A semiconductor integrated circuit device according to claim 2, wherein the semiconductor region has a bottom at a position deeper than the bottom of the shallow groove isolation.

4. A semiconductor integrated circuit device according to claim 1,
   wherein the element formation regions are first to third element formation regions,
   wherein the first and second element formation regions are exposed from the semiconductor substrate in a first semiconductor region having a first conductivity type,
   wherein the third element formation region is exposed from the semiconductor substrate in a second semiconductor region having a second conductivity type which is an opposite conductivity type to the first conductivity type,
   wherein a minimum width (H2) of the element isolation region between the third and the first or second element isolation regions is greater than a minimum width (H1) of the element isolation region between the first and second element formation regions, and
   wherein the bottom of each of the first and second semiconductor regions exists in the SiGe layer.

5. A semiconductor integrated circuit device according to claim 4, wherein the bottom of each of the first and second semiconductor regions exists at a position deeper than the bottom of the shallow groove isolation.

6. A semiconductor integrated circuit device according to claim 1, wherein the insulating film has a thermal oxide film formed over the inside wall of the groove and a second insulating film inside of the groove.

7. A semiconductor integrated circuit device according to claim 6, wherein a nitride film is formed between the thermal oxide film and the second insulating film.

8. A semiconductor integrated circuit device according to claim 7, wherein the nitride film is formed not over the bottom of the groove but over the side walls of the groove.

9. A semiconductor integrated circuit device according to claim 6, wherein the second insulating film is a silicon oxide film formed by CVD using ozone and tetraethoxysilane as raw materials.

10. A semiconductor integrated circuit device according to claim 1, wherein the second Si layer is formed to cover the shallow groove isolation.

11. A semiconductor integrated circuit device according to claim 1, wherein the second Si layer is made of single crystal Si.

12. A semiconductor integrated circuit device according to claim 1, wherein the second Si layer is made of polycrystalline Si.

13. A semiconductor integrated circuit device according to claim 1, wherein the second Si layer is formed not between the shallow groove isolation and the first Si layer but between the shallow groove isolation and the SiGe layer.

14. A semiconductor integrated circuit device according to claim 1,
   wherein the semiconductor element is MISFET, said MISFET having a gate electrode formed over the semiconductor substrate via a gate insulating film, and source and drain regions formed in the semiconductor substrate on both sides of the gate electrode, and
   wherein a conductive film existing as the same layer with the gate electrode is formed over the element isolation regions of the semiconductor substrate.

* * * * *